United States Patent [19]
Murayama et al.

[11] Patent Number: 5,766,811
[45] Date of Patent: Jun. 16, 1998

[54] METHOD OF MANUFACTURING AMORPHOUS SILICON ELECTROPHOTOGRAPHIC PHOTOSENSITIVE MEMBER

[75] Inventors: Hitoshi Murayama; Satoshi Kojima, both of Kyoto, Japan

[73] Assignee: Canon Kabushiki Kaisha, Tokyo, Japan

[21] Appl. No.: 617,665

[22] Filed: Mar. 13, 1996

Related U.S. Application Data

[62] Division of Ser. No. 216,445, Mar. 23, 1994, Pat. No. 5,512,510.

[30] Foreign Application Priority Data

Mar. 23, 1993 [JP] Japan ................................. 5-086873

[51] Int. Cl.$^6$ ................................................. G03G 5/082
[52] U.S. Cl. ................................................. 430/84; 430/128
[58] Field of Search ................................. 430/56, 83, 95, 430/128, 84

[56] References Cited

U.S. PATENT DOCUMENTS

| | | | |
|---|---|---|---|
| 4,471,042 | 9/1984 | Komatsu et al. | 430/64 |
| 4,664,937 | 5/1987 | Ovshinsky et al. | 437/101 |
| 5,187,115 | 2/1993 | Coleman | 437/101 |
| 5,190,838 | 3/1993 | Saitoh et al. | 430/85 |
| 5,223,457 | 6/1993 | Mintz et al. | 437/228 |
| 5,439,715 | 8/1995 | Okamura et al. | 427/575 |

FOREIGN PATENT DOCUMENTS

| | | | |
|---|---|---|---|
| 2746967 | 10/1977 | Germany | G03G 5/087 |
| 2855718 | 12/1978 | Germany | G03G 5/04 |
| 3046509 | 12/1980 | Germany | G03G 5/04 |
| 61-283116 | 12/1986 | Japan | H01L 12/205 |
| 63-35026 | 7/1988 | Japan | G03G 5/08 |

OTHER PUBLICATIONS

"Glow Discharge Processs" by Brian Chapman, pp. 168–169, John Wiley & Sons.

*Primary Examiner*—John Goodrow
*Attorney, Agent, or Firm*—Fitzpatrick, Cella, Harper & Scinto

[57] ABSTRACT

A method for stably manufacturing, with improved reproducibility, a good amorphous silicon electrophotographic photosensitive member improved in potential characteristics such as chargeability and photo-response as well as in the effect of reducing photo-memory and defects which cause spot image defects. A film is formed by plasma CVD on a base of the photosensitive member by using electromagnetic waves having a frequency of 13.56 MHz or higher as power for forming plasma under conditions that the spatial potential of plasma generated by the electromagnetic waves with respect to a base of the photosensitive member is not higher than 120 V and the current density of ions incident upon the base is not lower than 0.4 mA/cm$^2$.

7 Claims, 18 Drawing Sheets

ION CURRENT INJECTED INTO SUBSTRATE (mA/cm²)

PLASMA POTENTIAL [V]

METHOD OF MANUFACTURING AMORPHOUS SILICON ELECTROPHOTOGRAPHIC PHOTOSENSITIVE MEMBER

This application is a division of application Ser. No. 08/216,445 filed Mar. 23, 1994, now U.S. Pat. No. 5,512,510.

BACKGROUND OF THE INVENTION

1. Field of the Invention

This invention relates to a method for manufacturing a photosensitive member for electrophotography composed of amorphous silicon, amorphous silicon carbide or the like (hereinafter referred to as "a-Si") with improved reproducibility and stability.

2. Description of the Related Art

In the field of image forming, there is a need for photoconductive materials forming photosensitive members for electrophotography to have certain characteristics: a high sensitivity, a high S/N ratio [photocurrent (Ip)/dark current (Id)], an absorption spectrum matching with spectrum characteristics of irradiated electric waves, a fast photo-response, a desired dark resistance value, and causing no harm to the human body during use. In the case of an electrophotographic photosensitive member incorporated in electrophotographic apparatuses used for office work or the like, the quality of being harmless during use mentioned above is particularly important. It is also important that the electrophotographic photosensitive member should have little compact upon the environment after the completion of the useful life of the apparatus.

From this viewpoint, attention has been directed again to amorphous silicon as a photoconductive material. For example, in German Patent Laid-Open Publication Nos. 2746967 and 2855718, applications of amorphous silicon as an electrophotographic photosensitive material are described.

In German Patent Laid-Open Publication No. 3046509 there is proposed an electrophotographic photosensitive member formed of an electroconductive support and an a-Si photoconductive layer having halogen atoms as a constituent. According to the art disclosed in this publication, electrical and optical characteristics suitable for a photosensitive layer of an electrophotographic photosensitive member can be achieved by adding 1 to 40 atomic percent of halogen atoms to a-Si.

On the other hand, amorphous silicon carbide (hereinafter referred to as "a-SiC") is known as a material having high heat resistance and high surface hardness, having a high dark resistivity in comparison with a-Si and capable of exhibiting an optical band gap through the range of 1.6 to 2.8 eV by selecting the carbon content. In U.S. Pat. No. 4471042 there is proposed an electrophotographic photosensitive member having a photoconductive layer formed of such a-SiC. In the art disclosed in this publication, a photoconductive layer of an electrophotographic photosensitive member is formed by using a-Si containing 0.1 to 30 atomic percent of carbon as a chemical modifier to achieve improved electrophotographic characteristics, i.e., high dark resistance and high photo-sensitivity.

Further, in Japanese Patent Publication No. 63-35026 there is proposed an electrophotographic photosensitive member having, on an electroconductive support, an intermediate layer of a-Si having carbon atoms and hydrogen atoms and/or fluorine atoms as constituents (hereinafter referred to as "a-SiC (H, F)", and an a-Si photoconductive layer. The a-SiC (H, F) intermediate layer containing at least hydrogen atoms and/or fluorine atoms is provided to reduce cracks and separation of the a-Si photoconductive layer without impairing the desired photoconductive characteristics.

Plasma chemical vapor deposition (CVD) processes and sputtering processes are known as processes for forming such a-Si photosensitive members. Among plasma CVD processes used for this purpose, RF plasma CVD (RF-PCVD) processes are known as an ordinary forming process. An apparatus and a method for forming a deposited film by an RF-PCVD process will be described below.

FIG. 1 is a schematic diagram showing an example of an apparatus for manufacturing an electrophotographic photosensitive member supported on RF-PCVD. This apparatus is mainly constituted of a deposition unit 2000, a raw material gas supply unit 2200, and an evacuation unit (not shown) for reducing the internal pressure of a reaction chamber 2111. In the reaction chamber 2111 of the deposition unit 2000, a heater 2113 for heating a support 2112 and pipes 2114 for introducing raw material gases having raw material gas introducing holes are provided. A high frequency matching box 2115 is connected to the reaction chamber 2111. The support 2112 on which a layer or layers of a-Si photosensitive member are formed has, for example, a cylindrical shape such as that shown in FIG. 1, and is placed in a desired position in the reaction chamber 2111.

The raw material gas supply unit 2200 has bombs 2221 to 2226 containing raw material gases necessary for forming the desired layers, e.g., $SiH_4$, $H_2$, $CH_4$, NO, $NH_3$, and $SiF_4$, valves (2231 to 2236, 2241 to 2246, 2251 to 2256), and mass flow controllers 2211 to 2216. The raw material gas bombs are connected to gas introducing pipes 2114 in the reaction chamber 2111 through a valve 2260.

A deposited film can be formed by using this apparatus, for example, as described below. A cylindrical support 2112 is first placed in the reaction chamber 2111, and the interior of the reaction chamber 2111 is evacuated by the evacuation unit, not shown (e.g., a vacuum pump). Then, the temperature of the cylindrical support 2112 is controlled with the supporting member heater 2113 to be maintained at a predetermined temperature of 20° to 500° C.

To introduce raw material gases for forming a deposited film into the reaction chamber 2111, the closed state of each of the valves 2231 to 2236 of the gas bombs and a leak valve 2117 of the reaction chamber is confirmed, the opened state of each of the outflow valves 2251 to 2256 and the auxiliary valve 2260 is also confirmed, and a main valve 2118 is thereafter opened to evacuate the reaction chamber 2111 and a gas piping 2116.

Next, when a vacuum meter 2119 reads about $5 \times 10^{-5}$ Torr, the auxiliary valve 2260 and the outflow valves 2251 to 2256 are closed.

Thereafter, the gases are introduced from the gas bombs 2221 to 2226 by opening the valves 2231 to 2226, and the pressure of each gas is regulated at 2 kg/cm² with pressure regulators 2261 to 2266. Then, the inflow valves 2241 to 2246 are gradually opened to introduce the gases into the mass flow controllers 2211 to 2216.

After a film forming preparation step has been completed in the above-described manner, and when the temperature of the cylindrical support 2112 is maintained at the desired temperature, the needed outflow valves 2251 to 2256 and the auxiliary valve 2260 are gradually opened to introduce desired gases from the gas bombs 2221 to 2226 into the reaction chamber 2111 through the gas introducing pipes 2114.

Next, the flow rates of the raw material gases are controlled so as to be set to predetermined values by the mass flow controllers 2211 to 2216. Simultaneously, the opening of the main valve 2118 is adjusted while reading the vacuum meter 2119 so that the pressure in the reaction chamber 2111 is set to a desired pressure not higher than 1 Torr. When the internal pressure of the reaction chamber 2111 is stabilized, power from an RF power source (not shown) is set to a predetermined level, and the RF power is introduced into the reaction chamber 2111 through the high-frequency matching box 2115 to cause RF glow discharge. By the energy of this discharge, the raw material gases introduced into the reaction chamber 2111 are decomposed and a deposited film having predetermined silicon as a main component is formed on the cylindrical support 2112. When the thickness of the formed film becomes equal to a desired thickness, the outflow valves are closed to stop the gas flow into the reaction chamber 2111, thereby terminating the formation of the deposited film.

The same operations are repeated a certain number of times to form a desired multilayer photosensitive member.

Needless to say, when each layer is formed, the outflow valves other than those for introducing necessary gases are closed. Also, the operation of closing the outflow valves 2251 to 2256, opening the auxiliary valve 2260 and fully opening the main valve 2118 to evacuate the system to high vacuum is performed to remove remaining gases in the reaction chamber 2111 and in the piping between the outflow valves 2251 to 2256 an d the reaction chamber 2111, if necessary.

To improve the uniformity of film formation, the cylindrical support 2112 may be rotated at a desired speed by a drive unit (not shown) during film formation.

Needless to say, the kinds of gas and the valve operation described above may be changed according to conditions of formation of each layer.

A heating member adapted to use in vacuum may be used as a means for heating the support. Examples of the heating member are a sheath type wound heater, a plate-like heater, an electrical resistance heating member, such as a plate heater or a ceramic heater, a heat radiating lamp heating member, such as a halogen lamp or an infrared lamp, and a heating member having heat exch ange me ans using a liquid or a gas as a thermal medium. As a surface material of the heating means, a metal, such as stainless steel, nickel, aluminum or copper, a ceramic, a heat-resistant macromolecular resin or the like may be used. Other heating means may also be used. For example, a special heating chamber other than the reaction chamber may be provided to heat the support, and the heated support may be transported into the reaction chamber while being maintained in a vacuum.

Next, an apparatus and a method for forming a deposited film supported on another kind of plasma CVD process known as a microwave plasma CVD process will be described. FIG. 2 is a schematic diagram of the construction of an example of a reactor for forming a deposited film for an electrophotographic photosensitive member by a microwave plasma CVD (hereinafter referred to as "μW-PCVD"), and FIG. 3 is a schematic cross-sectional view of the reactor.

An apparatus for manufacturing an electrophotographic photosensitive member by μW-PCVD, constructed as described below, can be formed by connecting a deposition unit 3100 shown in FIG. 2, which is used in place of the deposition unit 2000 for RF-PCVD in the manufacturing apparatus shown in FIG. 1, to the raw material gas supply unit 2200.

This apparatus is constituted of a reaction chamber 3111 having a vacuum airtight structure and capable of being evacuated, the raw material gas supply unit 2200, and an evacuation unit (not shown) for decompressing the interior of the reaction chamber. In the reaction chamber 3111 are provided microwave introducing windows 3112 formed of a material through which microwave electric power can be efficiently transmitted to the interior of the reaction chamber and which can maintain a vacuum airtight condition (e.g., quartz glass, alumina ceramic or the like), microwave waveguides 3113 connected to a microwave power source (not shown) through a stab tuner (not shown) and an isolator (not shown), support heaters 3116, a raw material gas introducing pipe 3117, and an electrode 3118 for applying an external electrical bias for controlling a plasma potential. The interior of the reaction chamber 3111 communicates with a diffusion pump (not shown) through an evacuation pipe 3121. The raw material gas supply unit 2200 has bombs 2221 to 2226 containing necessary raw material gases, e.g., $SiH_4$, $H_2$, $CH_4$, NO, $NH_3$, and $SiF_4$, as in the case of RF-PCVD, valves (2231 to 2236, 2241 to 2246, 2251 to 2256), and mass flow controllers 2211 to 2216. The raw material gas bombs are connected to the gas introducing pipe 3117 in the reaction chamber 2111 through a valve 2260. A space 3130 surrounded by cylindrical supports 3115, which are placed in the reaction chamber 3111 and on which a layer or layers of an amorphous silicon photosensitive member is formed, is formed as a discharge space.

A deposited film can be formed by μW-PCVD using this apparatus as described below. Cylindrical supports 3115 are first placed in the reaction chamber 3111 and are rotated by driving devices 3120, and the interior of the reaction chamber 3111 is evacuated by the unillustrated evacuation unit (e.g., a vacuum pump) through the evacuation pipe 3121. The pressure in the reaction chamber 3111 is controlled so as to be maintained at $1 \times 10^{-6}$ Torr or lower. Then, the temperature of the cylindrical supports 3115 is increased and maintained at a predetermined temperature of 20° to 500° C. by the support heaters 3116.

To introduce raw material gases for forming a deposited film into the reaction chamber 3111, the closed state of each of the valves 2231 to 2236 of the gas bombs and a leak valve of the reaction chamber is confirmed, the opened state of each of the outflow valves 2251 to 2256 and the auxiliary valve 2260 is also confirmed, and a main valve (not shown) of the reaction chamber 3111 is thereafter opened to evacuate the reaction chamber 3111 and the gas pipe system of the same.

Next, when a vacuum meter (not shown) reads about $5 \times 10^{-5}$ Torr, the auxiliary valve 2260 and the outflow valves 2251 to 2256 are closed.

Thereafter, the gases are introduced from the gas bombs 2221 to 2226 by opening the valves 2231 to 2226, and the pressure of each gas is regulated at 2 kg/cm² with pressure regulators 2261 to 2266. Then, the inflow valves 2241 to 2246 are gradually opened to introduce the gases into the mass flow controllers 2211 to 2216.

After a film forming preparation step has been completed in the above-described manner, and when the temperature of the cylindrical supports 3115 is maintained at the desired temperature, necessary ones of the outflow valves 2251 to 2256 and the auxiliary valve 2260 are gradually opened to introduce desired ones of the gases from the gas bombs 2221 to 2226 into the reaction chamber 3111 through the gas introducing pipe 3117.

Next, the flow rates of the raw material gases are controlled so as to be set to predetermined values by the mass flow controllers 2211 to 2216. Simultaneously, the opening of the main valve is adjusted while reading the vacuum meter so that the pressure in the reaction chamber 3111 is set to a predetermined pressure not higher than 1 Torr. When the internal pressure of the reaction chamber 3111 is stabilized, microwaves having a frequency of 500 MHz or higher, more preferably 2.45 GHz, are generated by the microwave power source, the power from the microwave power source is set to a desired level, and microwave energy is introduced into the discharge space 3130 through the wave guides 3113 and microwave introducing windows 3112 to cause microwave glow discharge. Simultaneously, an electric bias, e.g., a direct current, is applied to the electrode 3118 from a power source 3119. As a result, in the discharge space 3130 surrounded by the supports 3115, the introduced raw material gases are dissociated by being excited with the microwave energy to form the desired deposited film on the cylindrical supports 3115. At this time, to improve the uniformity of film formation, the cylindrical supports 3115 are rotated at a desired speed by support rotating motors 3120.

When the thickness of the formed film becomes equal to a desired thickness, the supply of microwaves is stopped and the supply of the gases to the reaction chamber is stopped by closing the outflow valves, thereby terminating the formation of the deposited film.

The same operations are repeated a certain number of times to form a desired multilayer photosensitive member.

Needless to say, when each layer is formed, the outflow valves other than those for introducing necessary gases are closed, as in the case of RF-PCVD. Also, the operation of closing the outflow valves 2251 to 2256, opening the auxiliary valve 2260 and fully opening the main valve to evacuate the system to high vacuum is performed to remove remaining gases in the reaction chamber 3111 and in the piping between the outflow valves 2251 to 2256 and the reaction chamber 3111, if necessary.

Needless to say, the kinds of gas and the valve operation described above may be changed according to conditions of formation of each layer.

A heating member adapted to use in vacuum may be used as a means for heating the support, as in the case of the above-described RF-PCVD process. Alternatively, a special heating chamber other than the reaction chamber may be provided to heat the support, and the heated support may be transported into the reaction chamber while being maintained in a vacuum.

In the μW-PCVD process, the pressure in the discharge space is set, preferably, in the range of $1\times10^{-3}$ to $1\times10^{-1}$ Torr, more preferably, in the range of $3\times10^{-3}$ to $5\times10^{-2}$ Torr, and most preferably, in the range of $5\times10^{-3}$ to $3\times10^{-2}$ Torr.

The pressure outside the discharge space may be set to any pressure lower than that in the discharge space. However, the effect of improving the properties of the deposited film is particularly high, if the pressure in the discharge space is three times the pressure outside the discharge space or higher when the pressure in the discharge space is $1\times10^{-1}$ Torr or lower, more particularly when it is $5\times10^{-2}$ Torr or lower.

Microwaves are guided to the reactor, for example, by a method of using a waveguide, and are introduced into the reactor, for example, by a method of introduction through one or a plurality of dielectric windows. Such a microwave introducing window is ordinarily formed of a material of a small microwave loss, such as alumina ($Al_2O_3$), aluminum nitride (AlN), boron nitride (BN), silicon nitride (SiN), silicon carbide (SiC), silicon oxide ($SiO_2$), berylium oxide (BeO), Teflon or polystyrene.

The waveform and frequency of the voltage applied to the electrode are not particularly limited and the size and shape of the electrode may be selected freely as long as discharge is not disturbed. For practical use, it is preferable to form the electrode into the shape of a cylinder having a diameter in the range of 0.1 to 5 cm. Also, the length of the electrode may be set arbitrarily as long as an electric field is thereby applied uniformly to the support.

The electrode may be formed of any material as long as it has an electroconductive surface. Ordinarily, the electrode is, for example, a member formed of a metal, such as stainless steel, Al, Cr, Mo, Au, In, Nb, Te, V, Ti, Pt, Pd or Fe, an alloy of these metals, or a glass, ceramic or plastic member having a processed electroconductive surface.

FIG. 4 is a schematic cross-sectional view of an example of a-Si photosensitive members formed in the above-described manner. The illustrated photosensitive member has an electroconductive support 501 formed of Al or the like, a charge injection obstruction layer 502 for obstructing injection of charge from the electroconductive support 501, which is formed if necessary, a layer 503 formed of an amorphous material containing at least silicon atoms and having a photoconductive property, and a surface layer 504 provided if necessary by being formed of a material containing silicon atoms and carbon atoms and, if necessary, hydrogen atoms and/or halogen atoms. The surface layer 504 has a function of retaining electric charge and/or a function of improving characteristics relating to external factors, such as wear resistance and moisture resistance.

As described above, good electrophotographic photosensitive members have been manufactured by the electrophotographic photosensitive member manufacturing methods using RF-PCVD and μW-PCVD processes. However, there is a need to provide an electrophotographic photosensitive member having further improved performance in order to meet various demands with respect to recent electrophotographic apparatuses, for example, for a further reduction in the size of the apparatus, an increase in the operating speed of the apparatus and an improvement in image quality.

More specifically, when the size of an electrophotographic apparatus is reduced, a main charging device is also reduced in size with a reduction in the size of the apparatus. As a result, the corona current supplied to a photosensitive member is reduced. Therefore, it is necessary to achieve a further improvement in charging performance of the photosensitive member in order to obtain a required dark potential.

With respect to realization of high speed image formation, an improvement in chargeability of a photosensitive member is inevitably required with a reduction in charging time. Further, the photo-response must also be improved since the time period taken to transport a photosensitive member after the formation of a latent image by irradiation of image exposure light to a development device for developing the latent image is reduced.

With respect to improvements in image qualities, it is required that image defects such as spot defects appearing as black or white dots in an image should be reduced and that occurrence of ghosts or the like, i.e., a phenomenon of density unevenness caused in an image by a preceding-time latent image remaining as a photo-memory during image formation repeated a number of times, should be further reduced.

SUMMARY OF THE INVENTION

In view of these problems, an object of the present invention is to provide a manufacturing method whereby a good photosensitive member improved in potential characteristics such as chargeability and photo-response as well as in the effect of reducing photo-memory and defects which cause spot image defects can be stably manufactured with improved reproducibility.

To achieve this object, according to the present invention, there is provided a method of manufacturing an amorphous silicon electrophotographic photosensitive member by a plasma CVD process using electromagnetic waves having a frequency of 13.56 MHz or higher as power for generating plasma, in which a film is formed on a base of the photosensitive member under conditions that the spatial potential of plasma generated by the electromagnetic waves with respect to the base is not higher than 120 V and the current density of ions incident upon the base is not lower than 0.4 mA/cm$^2$.

DESCRIPTION OF THE PREFERRED EMBODIMENT

Figure 1:
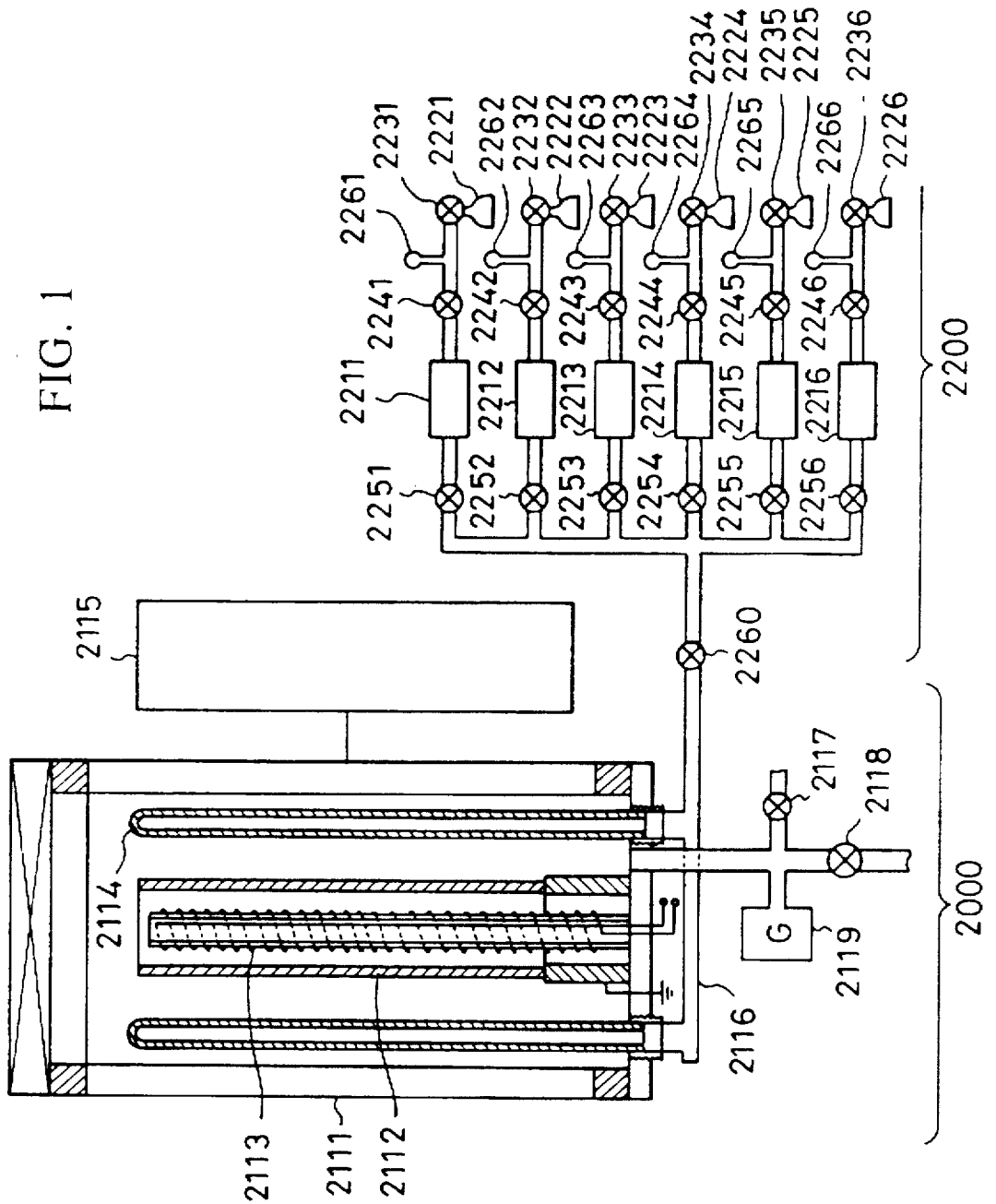
FIG. 1 is a diagram of an example of an apparatus for manufacturing an a-Si photosensitive member by an RF-PCVD process.
Figure 2:
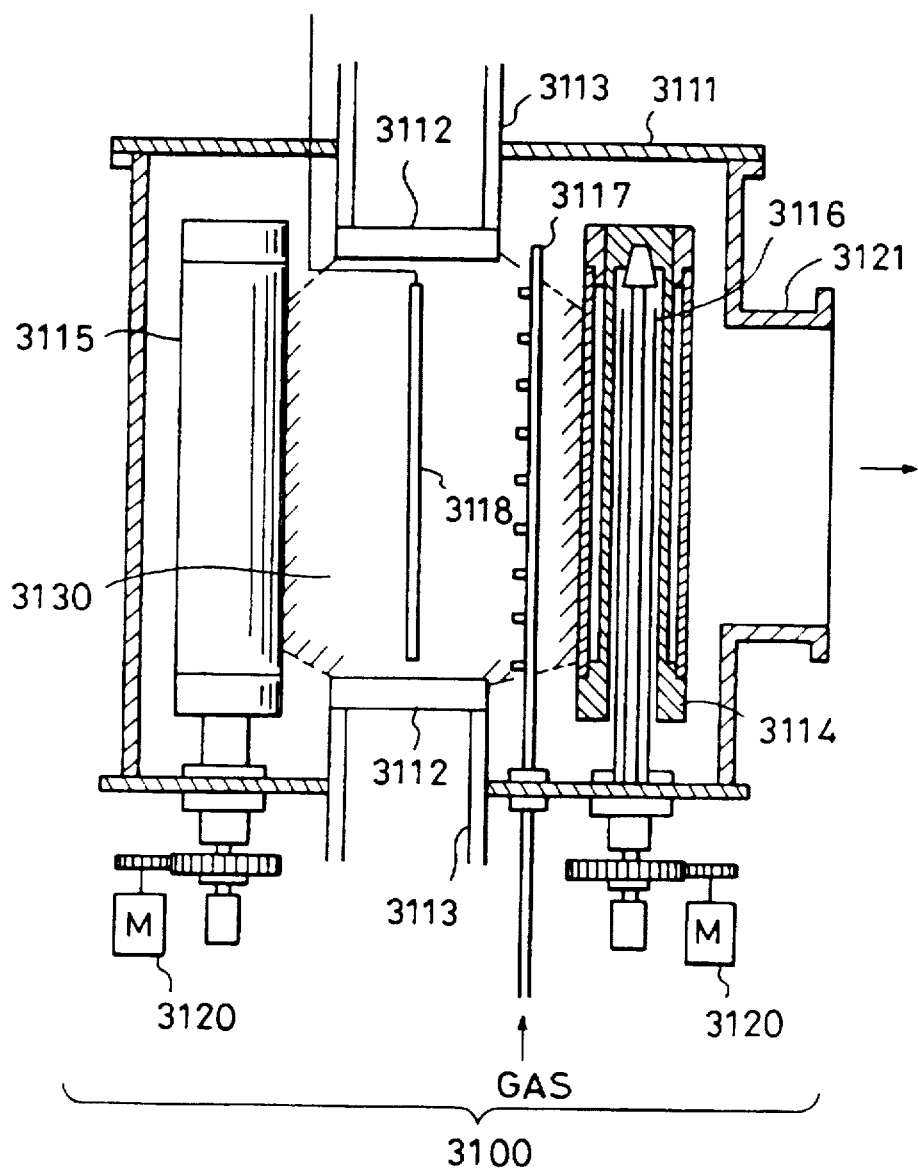
FIG. 2 is a diagram of an example of an apparatus for manufacturing an a-Si photosensitive member by a μW-PCVD process.
Figure 3:
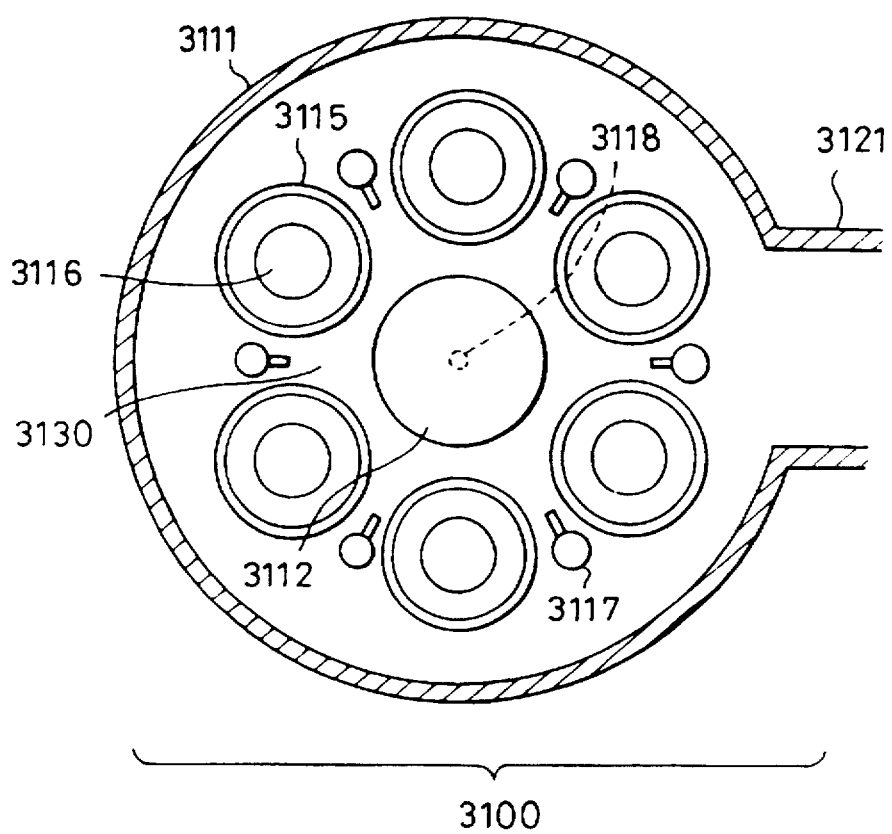
FIG. 3 is a cross-sectional view of the apparatus shown in FIG. 2.
Figure 4:
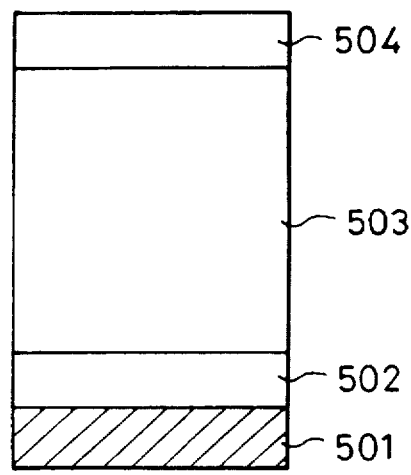
FIG. 4 is a schematic diagram of an example of the layer structure of an a-Si photosensitive member.

The inventors of the present invention have eagerly conducted studies and have found that, in manufacturing an amorphous silicon electrophotographic photosensitive member, the spatial potential of plasma on a base and the current density of ions incident upon the base are important factors for improvements in the photosensitive member. The present invention has been achieved on the basis of this finding.

That is, according to this finding, it is important that in a method of manufacturing an amorphous silicon electrophotographic photosensitive member by a plasma CVD process using at least electromagnetic waves having a frequency of 13.56 MHz or higher as power for generating plasma, the spatial potential of plasma generated by the electromagnetic waves with respect to a base and the current density of ions incident upon the base are set within predetermined ranges.

More specifically, according to this finding, the above-mentioned objects of the invention can be effectively achieved by setting the spatial potential of plasma generated by electromagnetic waves with respect to a base to a potential not higher than 120 V and the current density of ions incident upon the base to a value not smaller than 0.4 mA/cm$^2$ to form a film.

That is, if the spatial potential and the ion current density are set within the above-mentioned ranges, the manufactured amorphous silicon photosensitive member is improved in potential characteristics such as chargeability, photoresponse and residual potential while photo-memory and defects which cause spot image defects are reduced.

This effect is particularly high (a) if electromagnetic waves in the microwave band, particularly electromagnetic waves having a frequency of 2.45 GHz, are used as power for generating plasma, (b) if a film having a thickness of 3 μm or more is formed on the base under conditions that the spatial potential is not higher than 120 V and the incident ion current density is not lower than 0.4 mA/cm$^2$, and (c) if ions of atoms in the group VII and/or the group VI in the periodic table are caused to exist in plasma, preferably, to an amount of $1 \times 10^5$/cm$^3$ or more and, more preferably, to an amount in the range of $1 \times 10^5$/cm$^3$ to $1 \times 10^8$/cm$^3$.

This effect can be stably obtained with high reproducibility by increasing the current density of ions incident upon the base relative to that of ions incident upon places other than the base of the photosensitive member.

The cause or mechanism of realizing this effect is not clear but it is thought with certainty that good film growth is promoted by ion irradiation supplying suitable energy to atoms contributing to film deposition on the base surface.

As a means for supplying energy to atoms contributing to film deposition on the base surface, heating with a heater on the base surface may be performed. With respect to such a heating means, however, it is known that if the heating temperature is excessively high, the amount of hydrogen in the formed film is so reduced that dangling bond compensation is insufficient, resulting in a deterioration in film characteristics. In this case, the same energy supplying effect as that of ion irradiation cannot be obtained.

Japanese Patent Laid-Open Publication No. 61-283116 discloses a method of manufacturing a good electrophotographic photosensitive member by placing a bias application electrode in plasma and by applying a bias to this electrode. This methods suggests that a photosensitive member characteristic can be improved by increasing the spatial potential of plasma. However, with respect to a further improvement in photosensitive member characteristics and, in particular, a sufficient improvement in the effect of reducing defects which cause spot image defects, the amount of improvement is not sufficiently increased if only a bias is applied.

According to the present invention, the spatial potential of plasma is positively limited to a value not higher than 120 V, and the current density of ions incident upon the base, which has not specially been controlled as a particular parameter, is maintained at a value not smaller than 0.4 mA/cm$^2$, whereby potential characteristics and photo-memory characteristics are improved while defects which cause spot image defects are reduced. The method of the present invention is particularly effective in reducing spot defects, the occurrence of which has been a considerable hindrance to the improvements in photosensitive member characteristics.

The present invention will be described in detail with respect to various experimental examples.

(Experimental Example 1)

Figure 5:
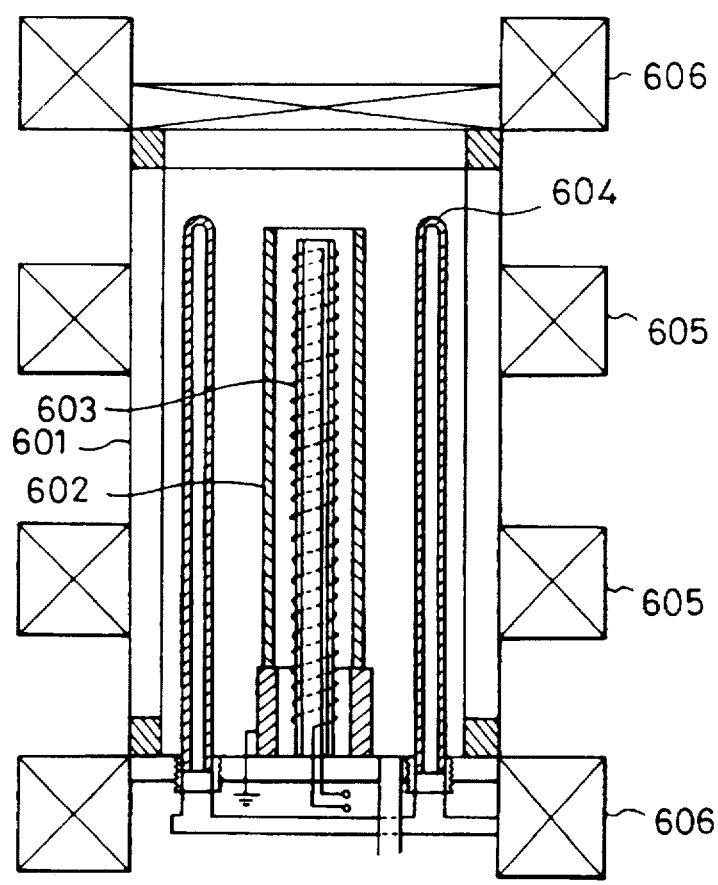
FIG. 5 is a diagram of an example of an RF-PCVD apparatus.

An RF-PCVD apparatus illustrated in FIG. 5 was used to make an experiment on controlling the spatial potential of plasma and the current density of ions incident upon a base. In FIG. 5 are illustrated a reaction chamber 601, a cylindrical support 602, a support heating heater 603, raw material gas introducing pipes 604, first coils 605 for forming a magnetic field, and second coils 606 for forming a magnetic field.

Figure 6:
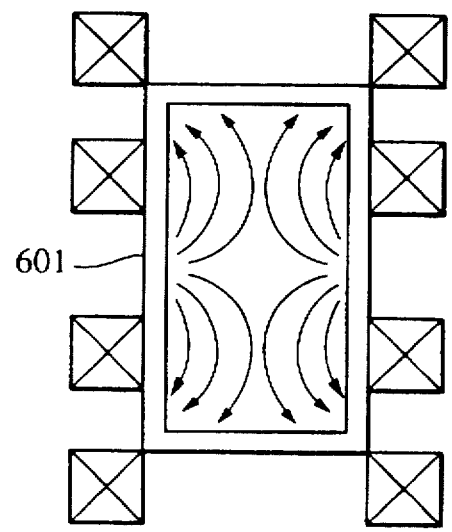
FIG. 6 is a schematic diagram of the shape of a magnetic field in the apparatus shown in FIG. 5.

A magnetic field was formed in the reaction chamber 601 as schematically shown in FIG. 6 by controlling the currents through the first magnetic field forming coils and the second magnetic field forming coils. In this experiment, the maximum magnetic field strength in the cylindrical reaction chamber 601 could be controlled in the range of 0 to 2 kG. The current density of ions incident upon the base was measured at a center of the base, and the plasma potential was measured with a Langmuir probe inserted in plasma.

Figure 7:
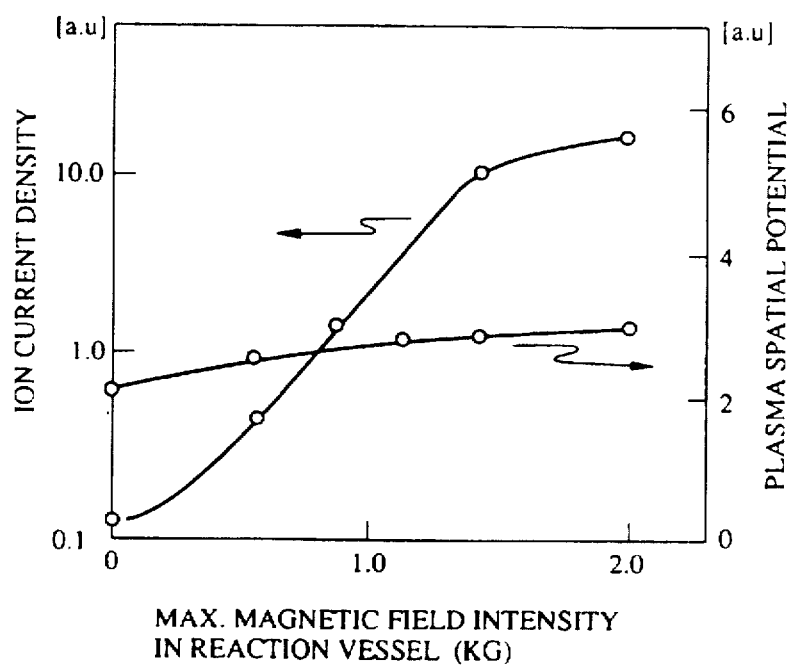
FIG. 7 is a graph of the relationship between the maximum magnetic field strength, the current of ions incident upon the photosensitive member base and the spatial potential of plasma in the reaction chamber of the apparatus shown in FIG. 5.

FIG. 7 shows the relationship between the maximum magnetic field strength in the reaction chamber 601, the spatial potential of plasma and the current density of ions incident upon the base under the conditions of a first photoconductive layer shown in Table 1. In FIG. 7, the ion current density and the plasma spatial potential are shown in arbitrary units (a. u.). In the apparatus shown in FIG. 6, the current density of ions incident upon the base can be mainly controlled without changing the film formation conditions.

(Experimental Example 2)

Figure 8:
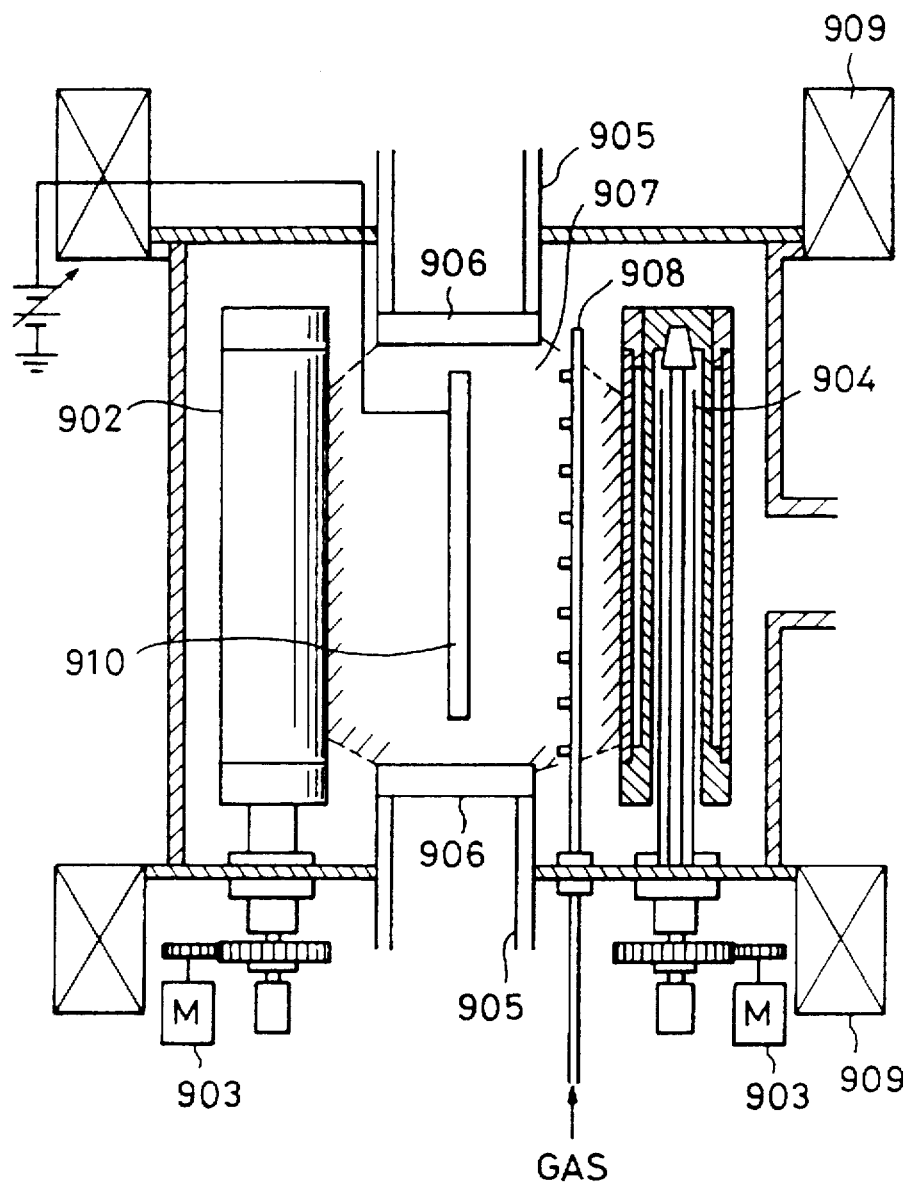
FIG. 8 is a diagram of an example of a μW-PCVD apparatus which can be used in accordance with the present invention.

A μW-PCVD apparatus illustrated in FIG. 8 was used to make an experiment on controlling the spatial potential of plasma and the current density of ions incident upon a base. In FIG. 8 are illustrated a reaction chamber 901, cylindrical supports 902, driving devices 903, support heating heaters 903, waveguides 905, microwave introducing windows 906, a discharge space 907, a gas introducing pipe 908, magnetic field forming coils 909, and a bias electrode 910.

Figure 9:
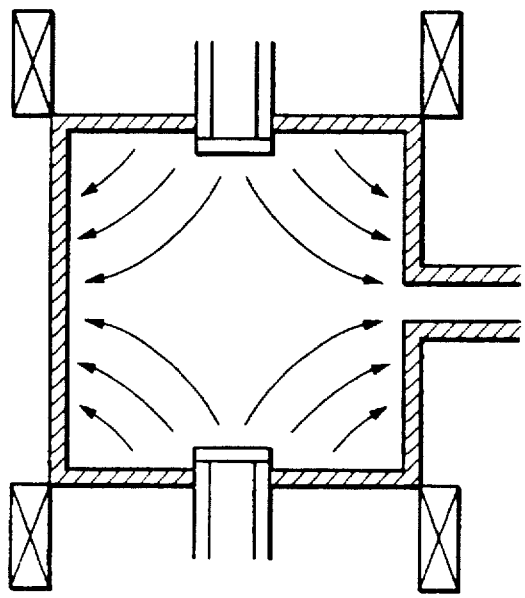
FIG. 9 is a schematic diagram of the shape of a magnetic field in the apparatus shown in FIG. 8.

A mirror magnetic field was formed in the reaction chamber 901 as schematically shown in FIG. 9 by controlling the currents through the magnetic field forming coils 910. In this experiment, the maximum magnetic field strength in the cylindrical reaction chamber 901 could be controlled in the range of 0 to 1.5 kG. The current density of ions incident upon the base was measured at a center of the base, and the plasma potential was measured with a Langmuir probe inserted in plasma.

Figure 10:
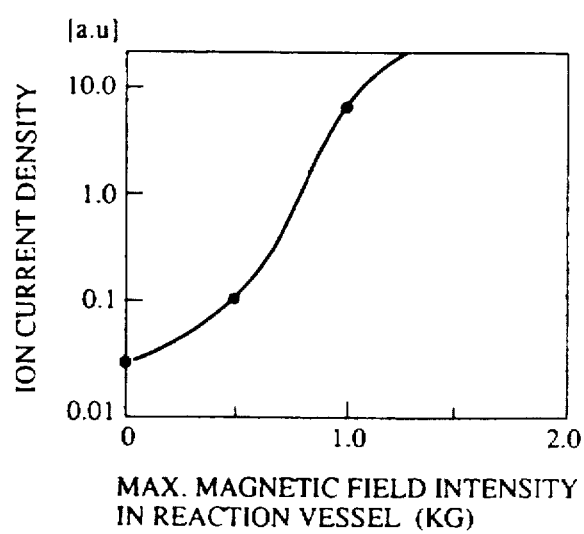
FIG. 10 is a graph of the relationship between the maximum magnetic field strength and the current of ions incident upon the photosensitive member base in the reaction chamber of the apparatus shown in FIG. 8.

FIG. 10 shows the relationship between the maximum magnetic field strength in the reaction chamber 901 and the current density of ions incident upon the base under the conditions of a first photoconductive layer shown in Table 2. The spatial potential of plasma was maintained always constantly by controlling the potential of the bias electrode 910. In FIG. 10, the ion current density is shown in an arbitrary unit (a. u.).

Figure 11:
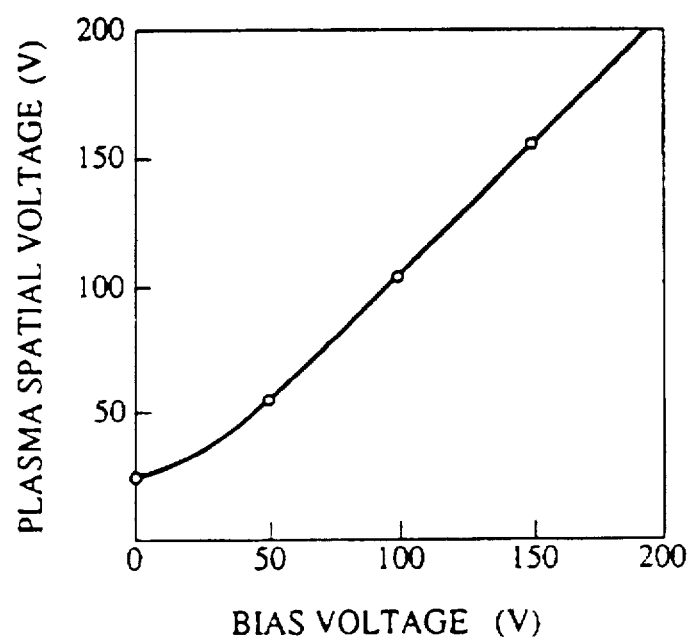
FIG. 11 is a graph of the relationship between the bias voltage and the plasma spatial potential in the apparatus shown in FIG. 8.

FIG. 11 shows the relationship between the bias electrode potential and the plasma spatial potential under the conditions shown in Table 2. The current density of ions incident upon the base was maintained always constantly by controlling the coil current.

From the results shown in FIGS. 10 and 11, it was understood that both the spatial potential of plasma and the current density of ions incident upon the base could be controlled in the apparatus of this experiment.

(Experimental Example 3)

A photosensitive member was manufactured under the conditions shown in Table 3 by using the apparatus used in Experimental Example 2, and the effects of the spatial potential of plasma and the current density of ions incident upon the base were examined. The time for forming film of each photoconductive layer was finely controlled so that the film thicknesses of the photosensitive member were equal with respect to all the conditions.

Figure 12A:
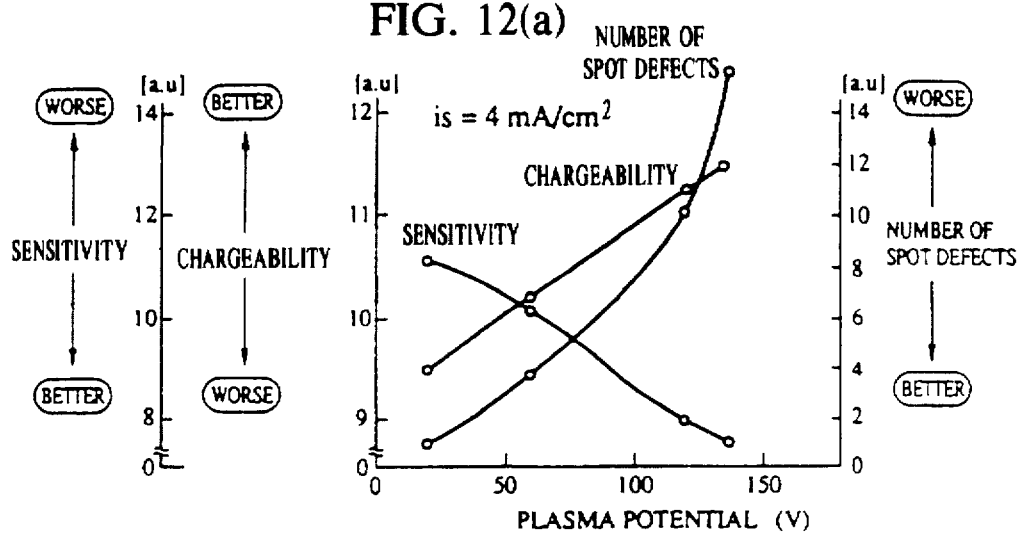
FIGS. 12(a) to 12(c) are graphs of the relationship between the plasma potential, the sensitivity, the chargeability and the number of spot defects as the results of experiments showing the effects of the present invention.
Figure 12B:
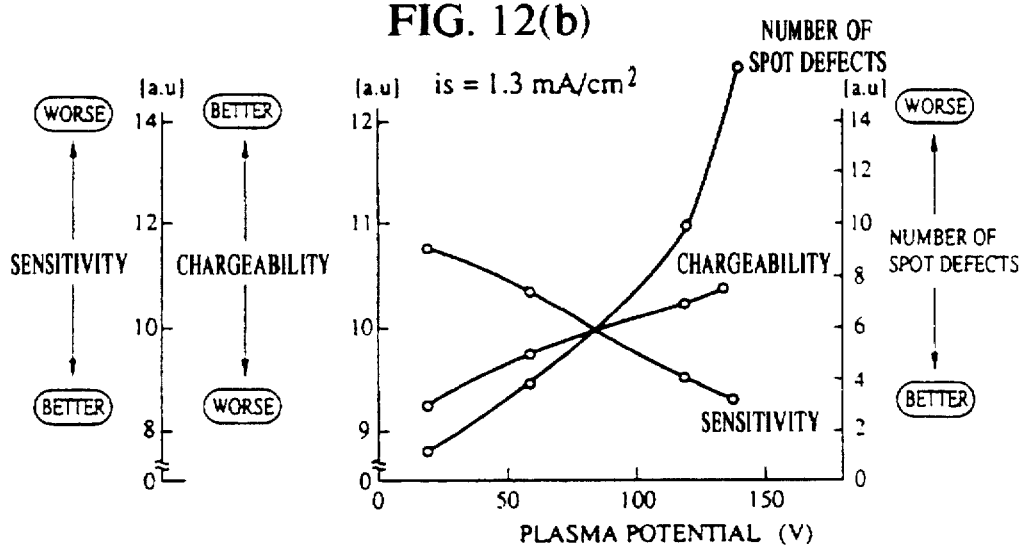
Figure 12C:
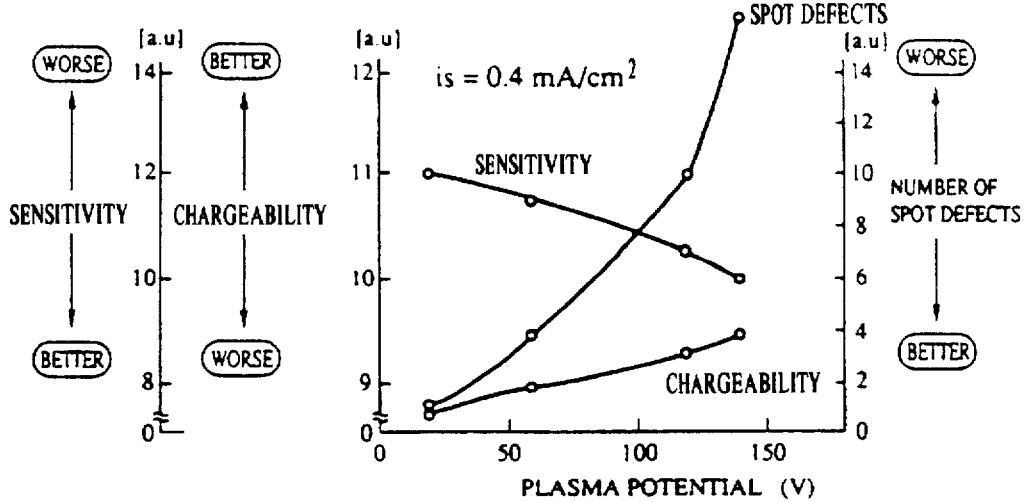

FIGS. 12(a) through 12(c) show changes in the chargeability, the sensitivity and the number of spot defects of the photosensitive member measured when the spatial potential of plasma was changed. The chargeability is represented by the surface potential of the photosensitive member measured when the photosensitive member was charged with a constant current value by corona discharge in a dark condition. The sensitivity is represented by the quantity of light required to reduce the surface potential of the photosensitive member to 50 V by halogen light after setting the surface potential to 400 V in a dark condition. The number of spot defects is represented by the number of spherical protrusions of 10 µm or greater existing in 9 cm² on the photosensitive member surface counted by microscopic observation. The ion current densities is in the measurements shown in FIGS. 12(a) to 12(c) are 4 mA/cm², 1.3 mA/cm² and 0.4 mA/cm², respectively.

Figure 13A:
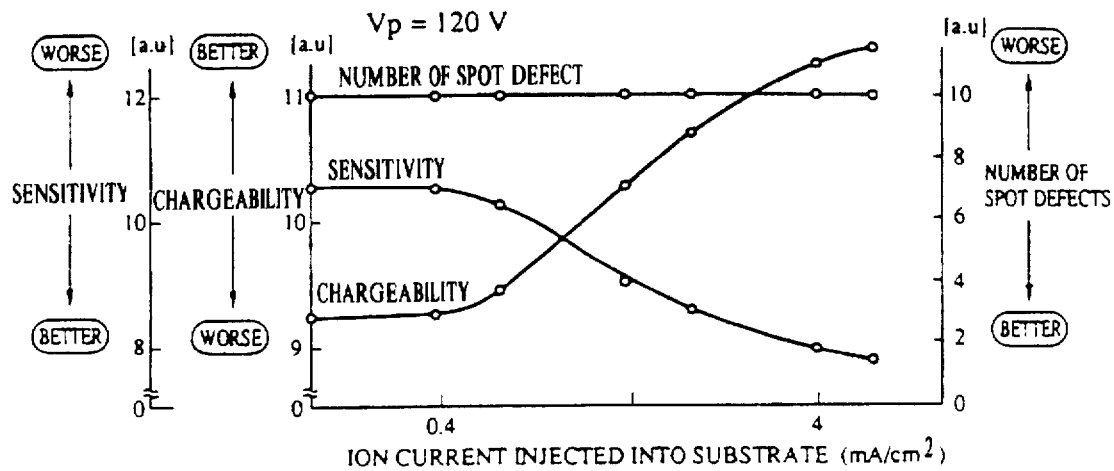
FIGS. 13(a) to 13(c) are graphs of the relationship between the current of ions incident upon the photosensitive member base, the sensitivity, the chargeability and the number of spot defects as the results of experiments showing the effects of the present invention.
Figure 13B:
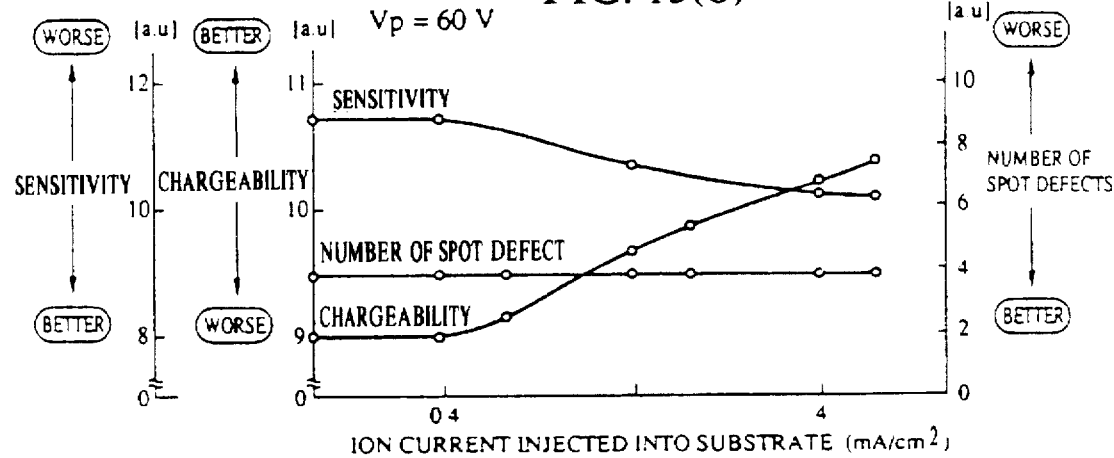
Figure 13C:
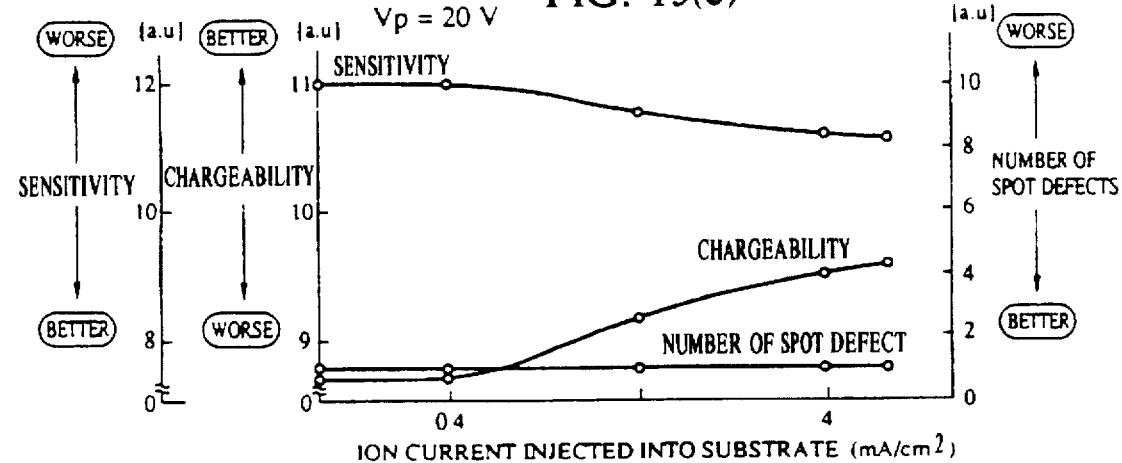

FIGS. 13(a) through 13(c) show changes in the chargeability, the sensitivity and the number of spot defects of the photosensitive member measured when current density of ions incident upon the base was changed. The plasma potentials Vp in the measurements shown in FIGS. 13(a) to 13(c) are 120 V, 60 V and 20 V, respectively.

From the results shown in FIGS. 12a through 12c and FIGS. 13a through 13c, the following is recognized. As the plasma spatial potential is increased, both the chargeability and the sensitivity are improved but the number of spot defects is steeply increased. On the other hand, with respect to the increase in the current density of ions incident upon the base, the chargeability and the sensitivity are improved when the ion current density is higher than 0.4 mA/cm², while the number of spot defects is constant. This effect is particularly high when the plasma spatial potential is higher. Thus, in manufacturing a photosensitive member having improved chargeability and sensitivity and a smaller number of spot defects, setting the plasma spatial potential to a potential not higher than 120 V and the current density of ions incident upon the base to a value not smaller than 0.4 mA/cm² is effective.

(Experimental Example 4)

Figure 14:
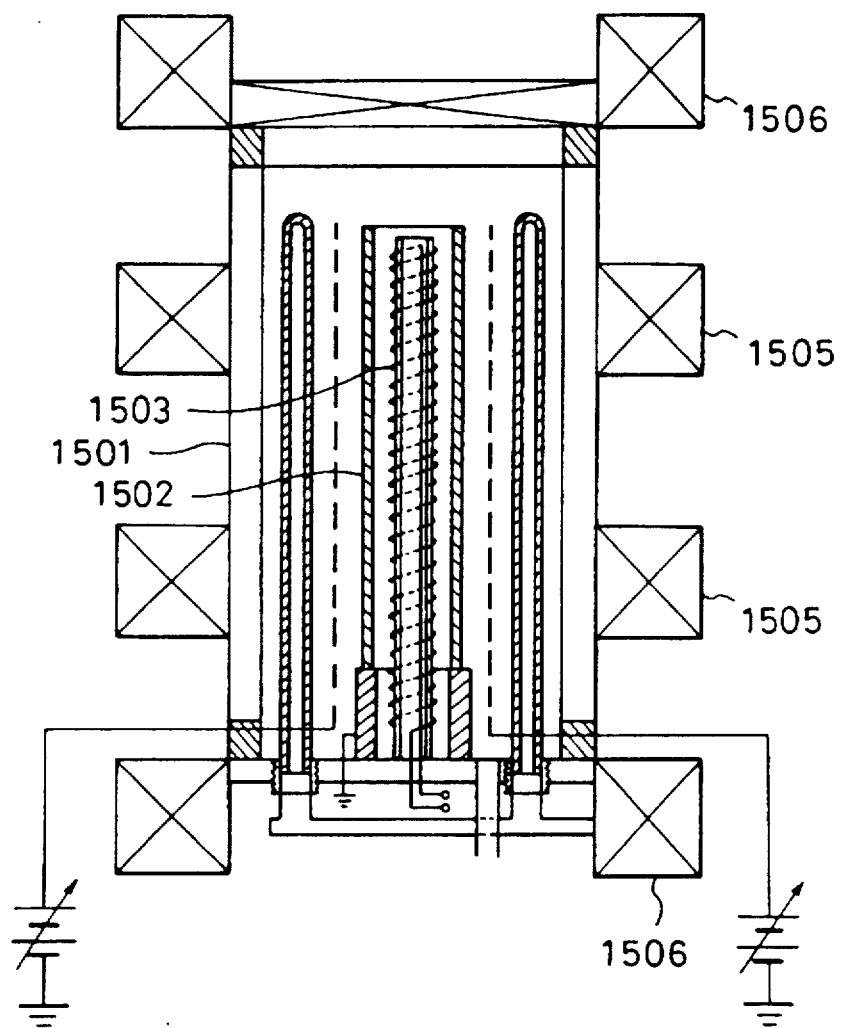
FIG. 14 is a diagram of an example of an RF-PCVD apparatus which can be used in accordance with the present invention.

An RF-PCVD apparatus illustrated in FIG. 14 was used to make an experiment on controlling the spatial potential of plasma and the current density of ions incident upon a base. In FIG. 14 are illustrated a reaction chamber 1501, a cylindrical support 1502, a support heating heater 1503, raw material gas introducing pipes 1504, first coils 1505 for forming a magnetic field, second coils 1506 for forming a magnetic field, and a mesh-like bias electrode 1507.

Changes in the spatial potential of plasma and the current density of ions incident upon the base were measured while the magnetic field strength was changed through the voltage applied to the mesh-like bias electrode 1507 and the currents through the magnetic field forming coils.

Figure 15:
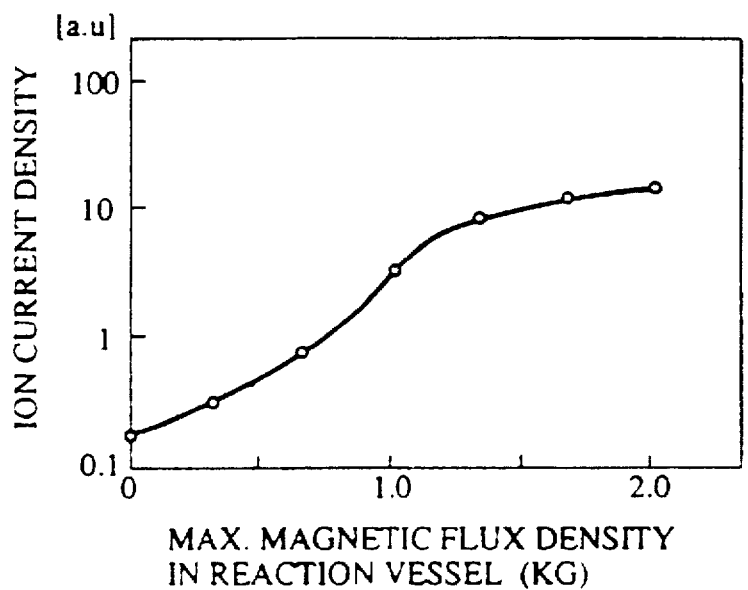
FIG. 15 is a graph of the relationship between the maximum magnetic field strength and the current of ions incident upon the photosensitive member base in the reaction chamber of the apparatus shown in FIG. 14.

FIG. 15 shows the relationship between the maximum magnetic field strength in the reaction chamber and the current density of ions incident upon the base under the conditions of the first photoconductive layer shown in Table 2. The spatial potential of plasma was maintained always constantly by controlling the potential of the bias electrode 1507.

Figure 16:
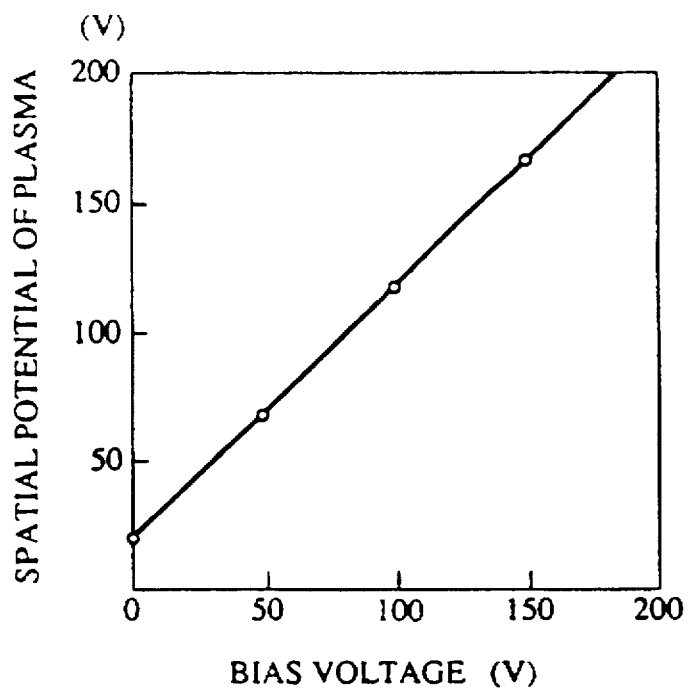
FIG. 16 is a graph of the relationship between the bias voltage and the plasma spatial potential in the apparatus shown in FIG. 14.

FIG. 16 shows the relationship between the bias electrode potential and the plasma spatial potential under the conditions of the first photoconductive layer shown in Table 2. The current density of ions incident upon the base was maintained always constantly by controlling the coil current.

From the results shown in FIGS. 15 and 16, it was understood that both the spatial potential of plasma and the current density of ions incident upon the base could be controlled in the apparatus of this experiment.

(Experimental Example 5)

A photosensitive member was manufactured under the conditions shown in Table 1 by using the apparatus used in Experimental Example 4, and the effects of the spatial potential of plasma and the current density of ions incident upon the base were examined. The time for forming film of each photoconductive layer was finely controlled so that the film thicknesses of the photosensitive member were equal with respect to all the conditions.

Figure 17A:
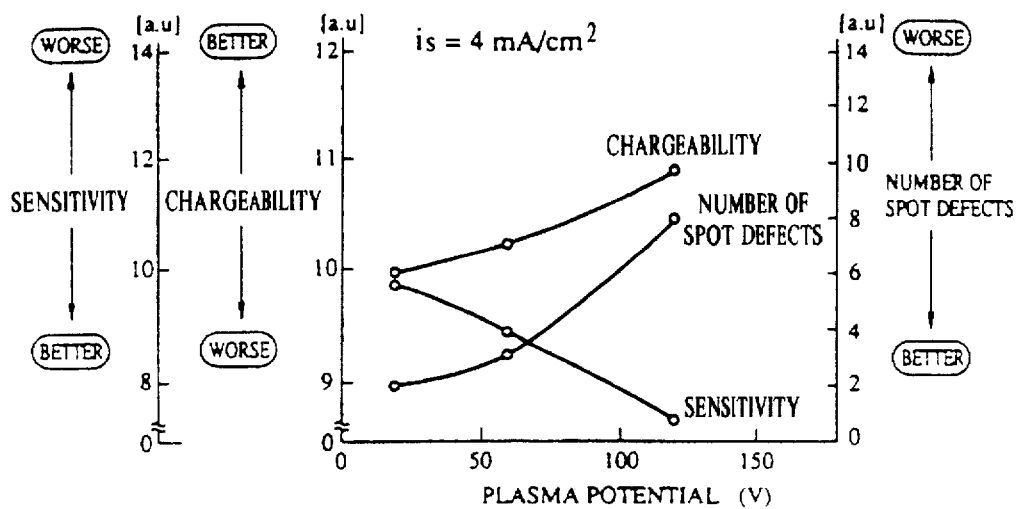
FIGS. 17(a) to 17(c) are graphs of the relationship between the plasma potential, the sensitivity, the chargeability and the number of spot defects as the results of experiments showing the effects of the present invention.
Figure 17B:
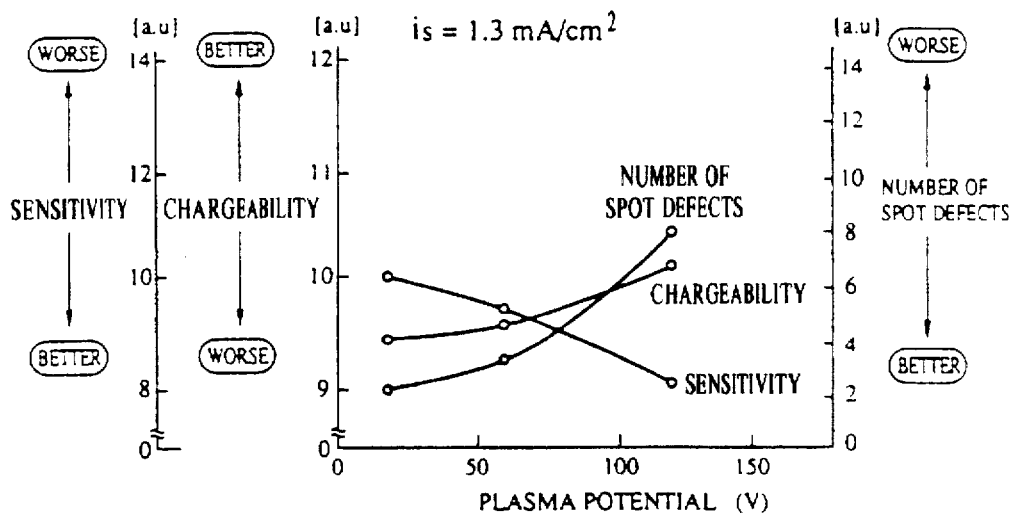
Figure 17C:
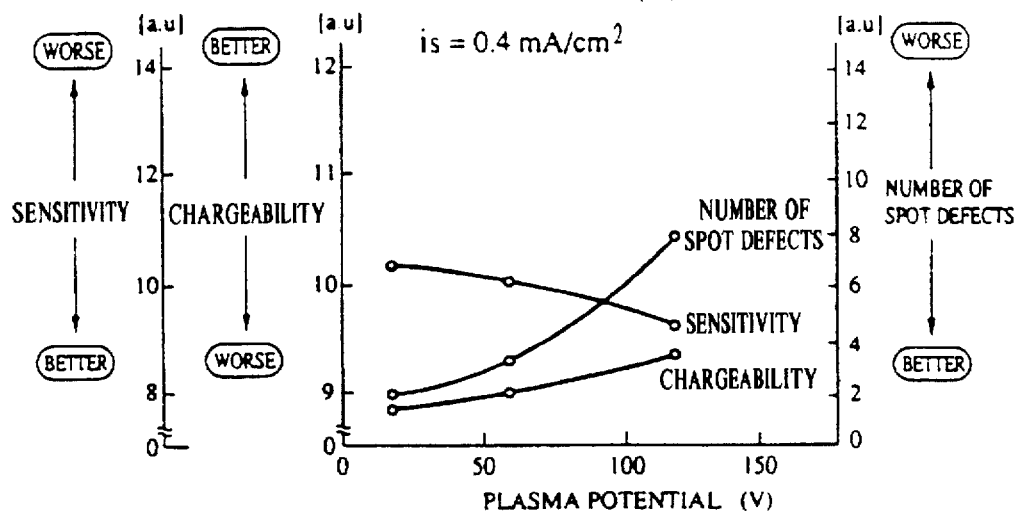

FIGS. 17(a) through 17(c) show changes in the chargeability, the sensitivity and the number of spot defects of the photosensitive member measured when the spatial potential of plasma was changed. The chargeability is represented by the surface potential of the photosensitive member measured when the photosensitive member was charged with a constant current value by corona discharge in a dark condition. The sensitivity is represented by the quantity of light required to reduce the surface potential of the photosensitive member to 50 V by halogen light after setting the surface potential to 400 V in a dark condition. The number of spot defects is represented by the number of spherical protrusions of 10 µm or greater existing in 9 cm² on the photosensitive member surface counted by microscopic observation. The ion current densities is in the measurements shown in FIGS. 17(a) to 17(c) are 4 mA/cm², 1.3 mA/cm² and 0.4 mA/cm², respectively.

Figure 18A:
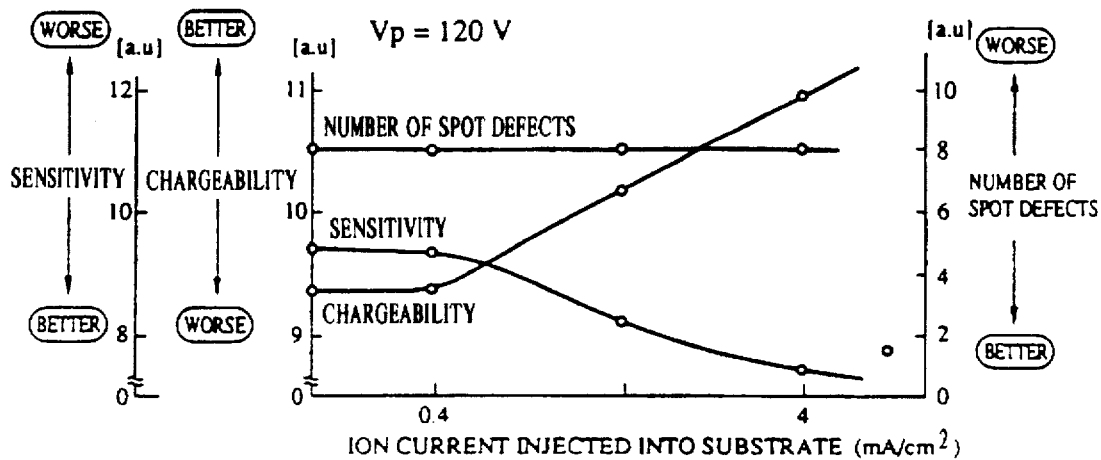
FIGS. 18(a) to 18(c) are graphs of the relationship between the current of ions incident upon the photosensitive member base, the sensitivity, the chargeability and the number of spot defects as the results of experiments showing the effects of the present invention.
Figure 18B:
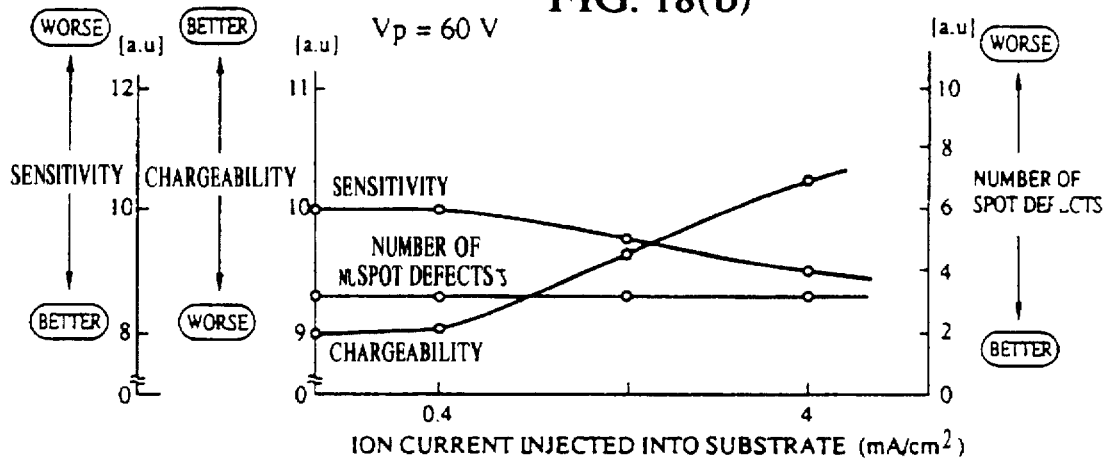
Figure 18C:
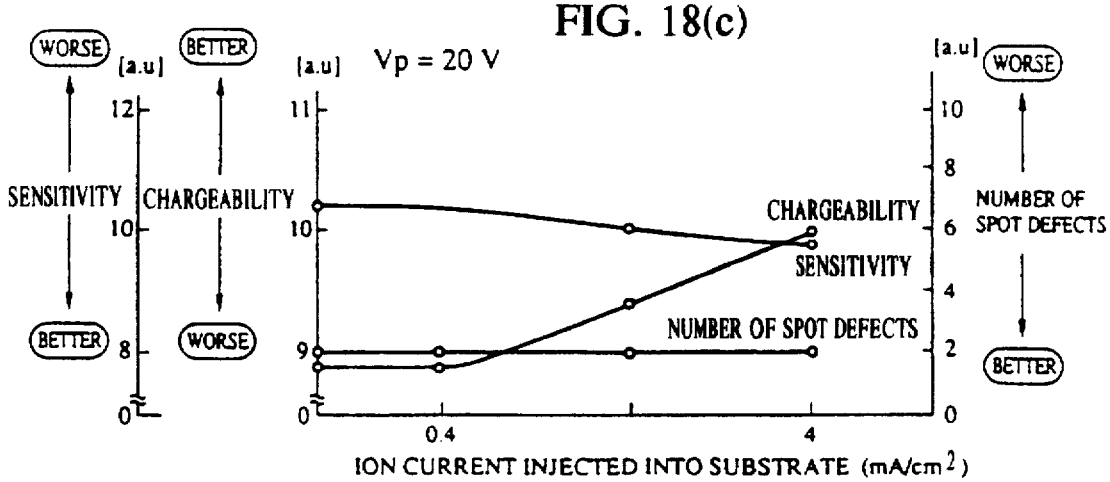
Figure 19A:
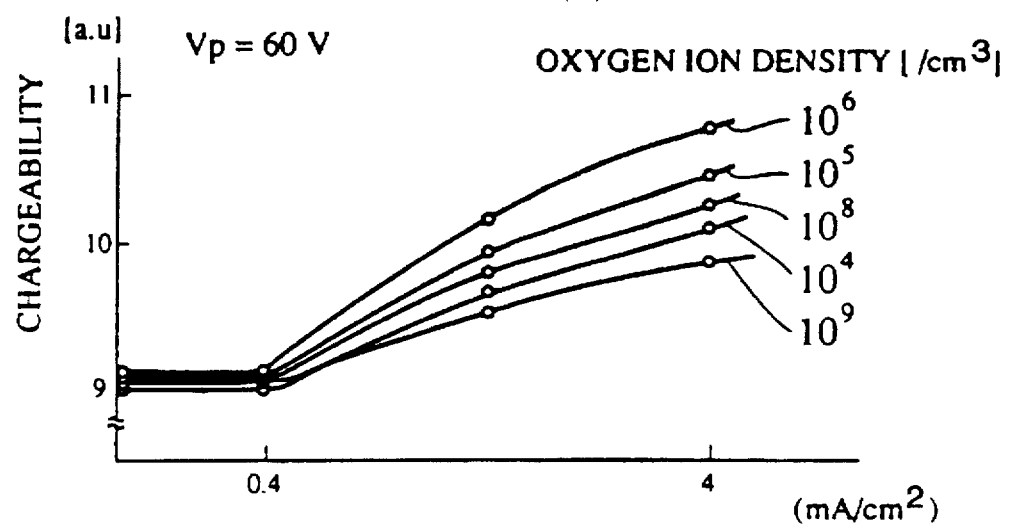
FIGS. 19(a) to 19(c) are graphs of the relationship between the current of ions incident upon the photosensitive member base, the sensitivity, the chargeability and the number of spot defects with the oxygen ion density used as a parameter, showing the results of experiments showing the effects of the present invention.
Figure 19B:
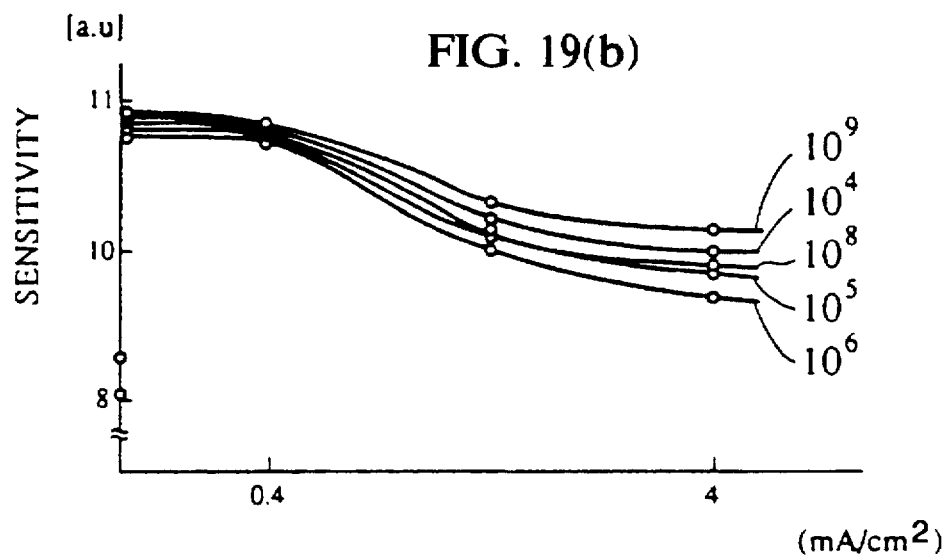
Figure 19C:
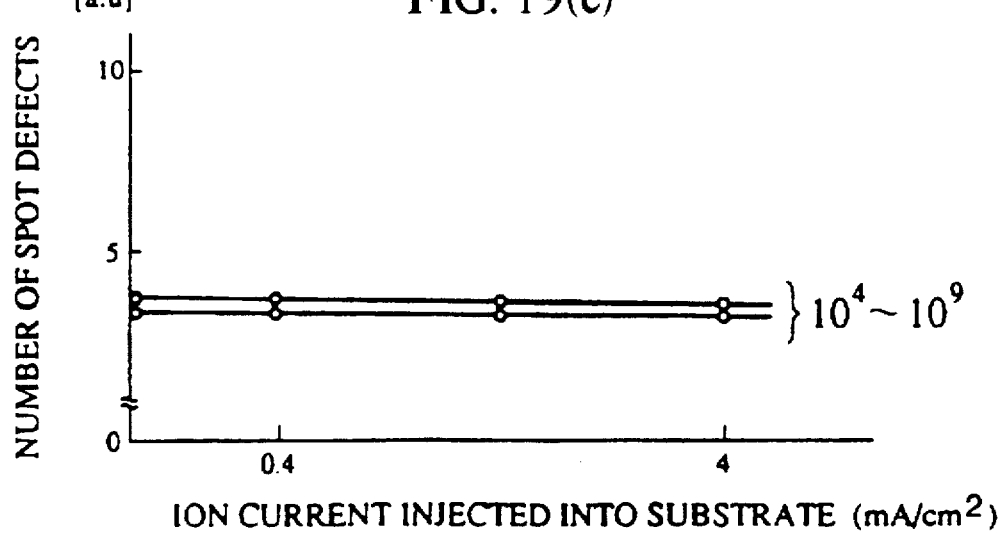
Figure 20A:
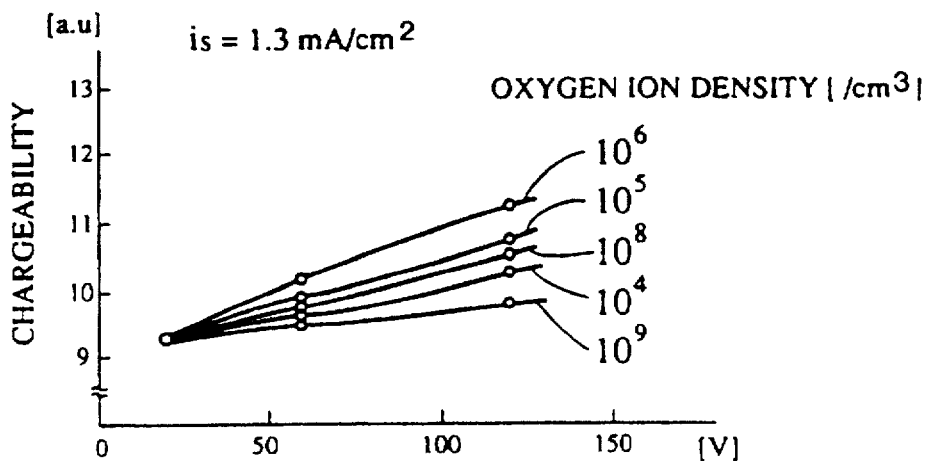
FIGS. 20(a) to 20(c) are graphs of the relationship between the plasma potential, the sensitivity, the chargeability and the number of spot defects with the oxygen ion density used as a parameter, showing the results of experiments showing the effects of the present invention.
Figure 20B:
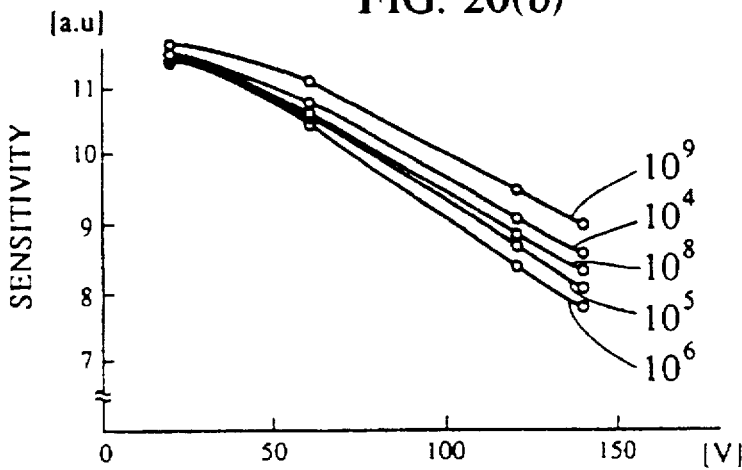
Figure 20C:
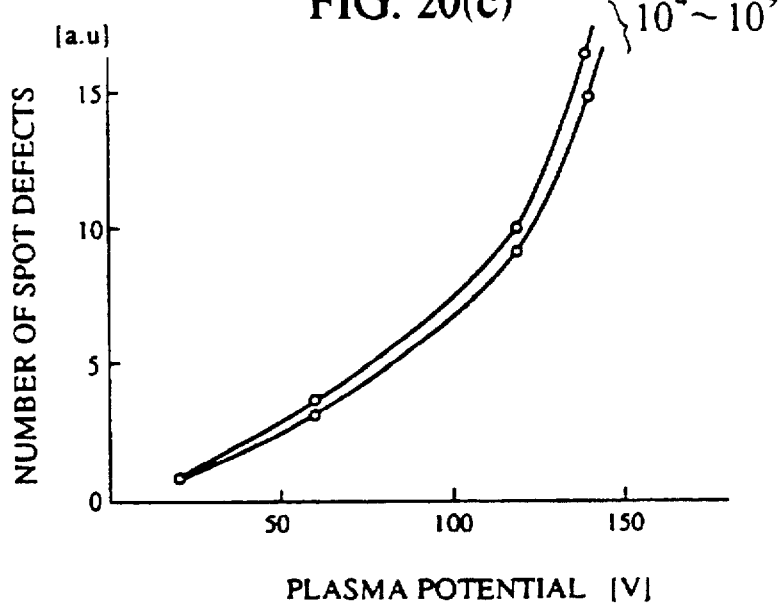

FIGS. 18(a) through 18(c) show changes in the chargeability, the sensitivity and the number of spot defects of the photosensitive member measured when current density of ions incident upon the base was changed. The plasma potentials Vp in the measurements shown in FIGS. 18(a) to 18(c) are 120 V, 60 V and 20 V, respectively.

As can be understood from FIGS. 17a through 17c and FIGS. 18a through 18c, the same results as those in Experimental Example 3 were obtained. It was thereby understood that, in manufacturing a photosensitive member having improved chargeability and sensitivity and a smaller number of spot defects, setting the plasma spatial potential to a potential not higher than 120 V and the current density of ions incident upon the base to a value not smaller than 0.4 mA/cm² is effective.

(Experimental Example 6)

An a-SiC photosensitive member was manufactured by a process using the apparatus used in Experimental Example 3, in which, under the conditions of the second photoconductive layer shown in Table 3, $CO_2$ was introduced, the amount of $B_2H_6$ was finely controlled and the oxygen ion density in plasma was changed. FIGS. 19(a) through 19(c) and 20(a) through 20(c) show changes in the chargeability, the sensitivity and the number of spot defects of the photosensitive member measured when the plasma spatial potential, the current density of ions incident upon the base and the oxygen ion density in plasma were changed. The chargeability, the sensitivity and the number of spot defects were evaluated in the same manner as Experimental Example 5. Also in this case, measurements were performed by setting the same values of the ion current density is and the plasma spatial potential Vp as in the case of Experimental Example 5.

From the results of these measurements, it was understood that a particularly high effect could be obtained by setting the current density of ions incident upon the base to 0.4 mA/cm² or higher and the oxygen ion density in plasma, preferably, to 1×10⁵/cm³ and, more preferably, within the range of 1×10⁵/cm³ to 1×10⁸/cm³.

The same experiments were made with respect to ions of other atoms in the groups VI and VII in the periodic table. It was confirmed that the same effect can be achieved with respect to these ions.

(Experimental Example 7)

Figure 21:
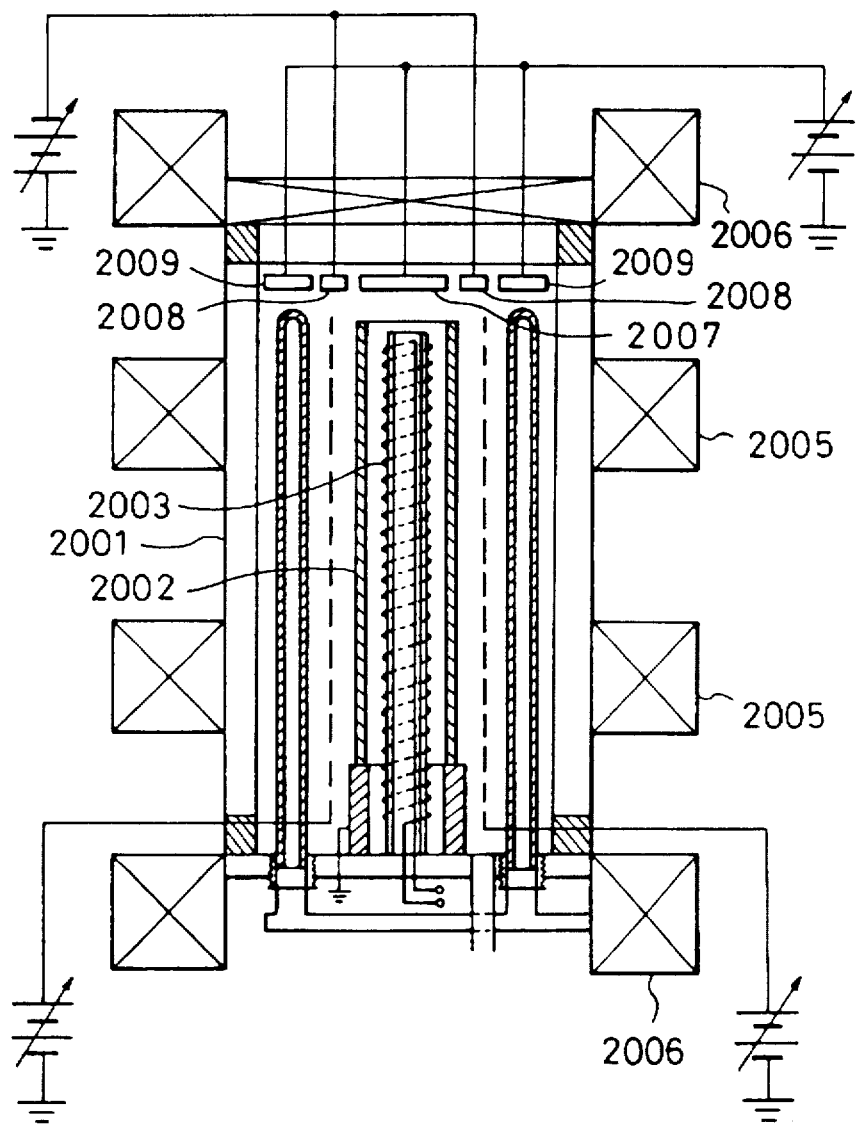
FIG. 21 is a diagram of an example of an RF-PCVD apparatus which can be used in accordance with the present invention.

The apparatus used in Experimental Example 4 was remodeled and three auxiliary electrodes 2007 to 2009 provided as a first to third auxiliary electrodes, respectively, were placed as shown in FIG. 21. photosensitive members were manufactured 100 times under the conditions shown in Table 1 while setting the first and third auxiliary electrodes to the same potential and selecting and controlling the potential of the second auxiliary electrode so as to change the current density of ions incident upon the second electrode. The reproducibility of the photosensitive member was thereby examined. The plasma potential was set to 80 V and the current density of ions incident upon the case was set to 1 mA/cm². The potential characteristics and the image characteristics of the manufactured photosensitive members were evaluated in the same manner as Experimental Example 5.

Figure 22A:
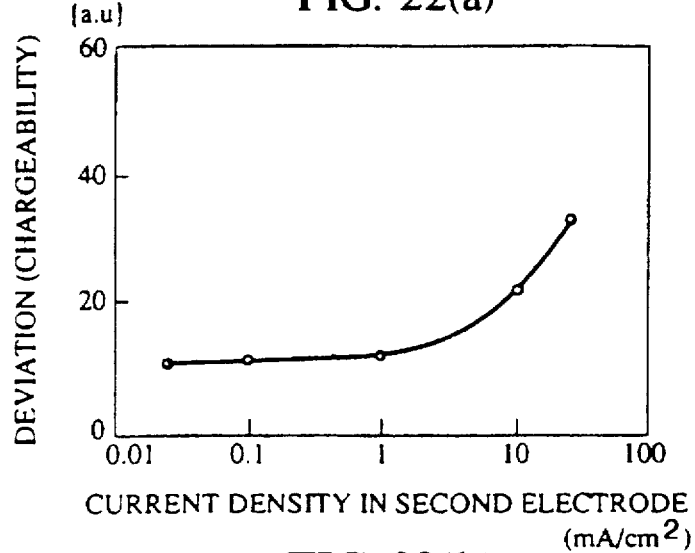
FIGS. 22(a) to 22(c) are graphs of the relationship between the second current density, the sensitivity, the chargeability and deviations of spot defects in the apparatus shown in FIG. 21, showing the results of experiments showing the effects of the present invention.
Figure 22B:
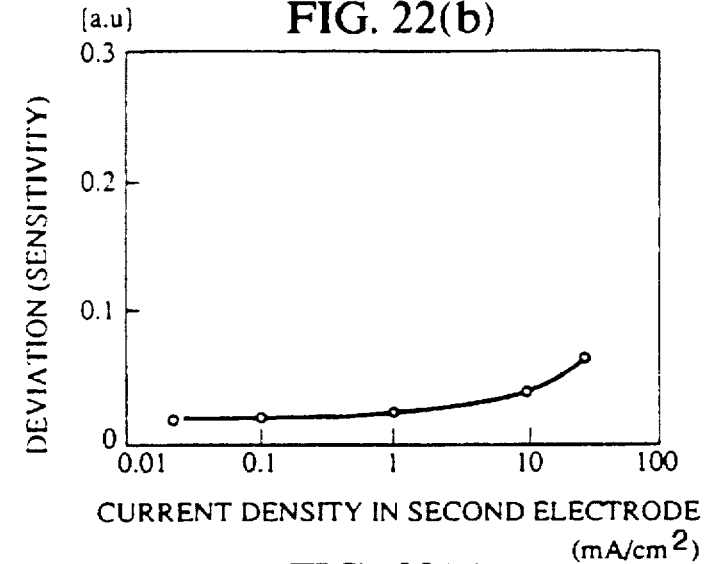
Figure 22C:
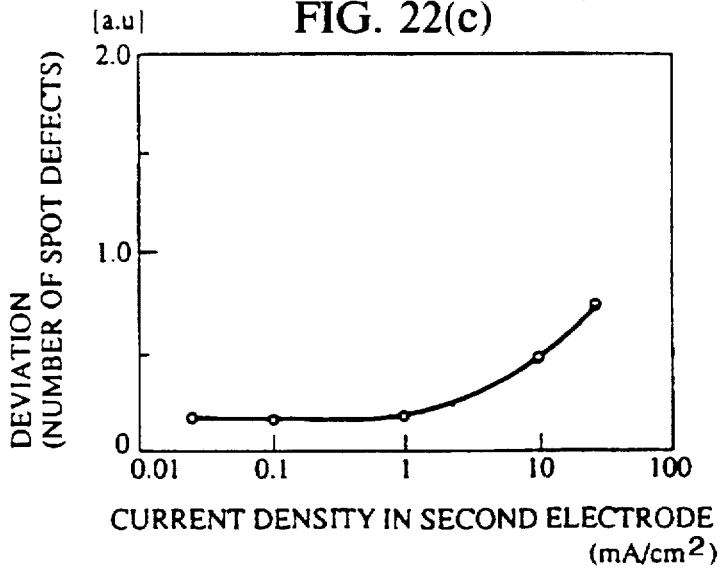

FIGS. 22(a) through 22(c) show deviations of the chargeability, the sensitivity an the number of spot defects through 100 times. From these results, it was understood that the effect of the present invention can be obtained stably with improved reproducibility by increasing the current density of ions incident upon the base relative to that of ions incident upon places other than the base.

Examples of the present invention will be described to further explain the invention. However, the present invention is not limited to the examples described below.

(Example 1)

An a-Si photosensitive member was manufactured by using the apparatus used in Experimental Example 4 under the conditions shown in Table 1. The plasma potential was set to 60 V and the current density of ions incident upon the base was set to 2 mA/cm². Table 4 shows the results of measurements of the potential and image characteristics of the manufactured photosensitive member. A copying machine NP-5060 made by Canon Inc. was used to evaluate the image characteristics, and the potential characteristics were evaluated by setting a potential measuring jig in place of the development device in the machine NP-5060.

For the evaluation, methods shown below were used with respect to evaluation items.

Chargeability . . . The dark portion potential at a development device position is measured when a constant current is caused to flow through the main charging device of the copying machine. Accordingly, the chargeability is higher if the dark current potential is higher.

Sensitivity . . . The sensitivity is evaluated by adjusting the main charging device current so that the dark portion potential at the development device position is set to a constant value, by using white paper having a reflection density of 0.01 or lower as an original and by measuring the image exposure light quantity adjusted so that the bright portion potential at the development device position is set to a predetermined value. Accordingly, the sensitivity is better if the image exposure light quantity is smaller.

Combined potential characteristic . . . Four evaluation items, including potential non-uniformity and potential shifts as well as chargeability and sensitivity, are synthetically evaluated. Potential non-uniformity and potential shifts are evaluated by the following methods.

Potential non-uniformity . . . Dark portion nonuniformity at the development device position when a constant current is caused to flow through the main charging device of the copying machine, and Bright portion non-uniformity at the development device position when white paper having a reflection density of 0.01 or lower is used as an original are measured and evaluated.

Potential shifts . . . Continuous copying operation is performed by causing a constant current through the main charging device, and changes in the dark portion potential at the development device position are measured.

Photo-memory . . . The current value of the main charging device is adjusted so that the dark portion potential at the development device position is set to a predetermined value, and the image exposure light quantity is thereafter adjusted so that the bright portion potential when predetermined white paper is used as an original is set to a predetermined value. In this state, a sheet prepared by attaching black circular marks having a reflection density of 1.1 and a diameter of 5 mm to a ghost chart made by Canon (part number: FY9-9040) is placed on the original table, and a half-tone chart made by Canon is superposed on this sheet. A copy image is formed in this manner. In the obtained copy image, the difference between the reflection density of the 5 mm diameter black circles of the ghost chart recognized on the half-tone copy and the reflection density of the half-tone portion is measured.

Spot defects . . . Copying is performed without lighting the original illumination lamp of the copying machine, and the number of white dots having a diameter of 0.3 mm or larger in the obtained black copy image is counted.

Combined image characteristic . . . The copied image is synthetically evaluated with respect to the characteristics including photo-memory and spot defects.

Combined . . . The combined potential characteristic and the combined image characteristic are synthetically evaluated.

The above-described evaluation uses ten ranks: an average evaluated value is set to rank 5, lower values are shown as lower ranks 4, 3, 2 and 1 in accordance with the inferiority degree, and higher levels are shown as higher ranks 6, 7, 8, and 10.

In this example, as shown in Table 4, both the potential characteristics and the image characteristics were good. In particular, a very good result was obtained with respect to spot defects. Thus, the effect of the present invention was confirmed.

(Comparative Example 1)

An a-Si photosensitive member was manufactured in the same manner as Example 1 except that the current density of ions incident upon the base was set to 0.2 mA/cm². Table 4 shows the results of measurements of the potential and image characteristics of the manufactured photosensitive member. The potential and image characteristics were evaluated in the same manner as Example 1. In comparison with Example 1, reductions in chargeability and sensitivity and an increase in photo-memory were recognized.

Although substantially no influence of photo-memory was recognized at the time of copying a character original, the level of photo-memory at the time of copying an image original such as a photograph having many half-tone portions was so high that the influence was definitely recognizable. A definite difference was recognized from the photo-memory effect of Example 1 in which substantially no memory was recognized a the time of copying the same original. Also, with a reduction in sensitivity, a fog was caused when a character original on color paper was copied, and the resulting copied image was not sufficiently clear.

(Example 2)

An a-SiC photosensitive member was manufactured by using the apparatus used in Experimental Example 3 under the conditions shown in Table 3. The plasma potential was set to 120 V and the current density of ions incident upon the base was set to 2 mA/cm$^2$. The results of measurements of the potential and image characteristics of the manufactured photosensitive member are shown in Table 4. The potential and image characteristics were evaluated in the same manner as Example 1. Both the potential characteristics and the image characteristics were very good. In particular, a very good result was obtained with respect to photo-memory and the effect of the present invention was confirmed.

(Comparative Example 2)

An a-SiC photosensitive member was manufactured in the same manner as Example 2 except that the current density of ions incident upon the base was set to 0.2 mA/cm$^2$. The results of measurements of the potential and image characteristics of the manufactured photosensitive member are shown in Table 4. The potential and image characteristics were evaluated in the same manner as Example 1. In comparison with Example 1, a deterioration was recognized in every respect excepting spot defects.

With a reduction in sensitivity, a fog was caused when a character original on color paper was copied, and the resulting copied image was not sufficiently clear.

(Comparative Example 3)

An a-SiC photosensitive member was manufactured in the same manner as Example 2 except that the plasma potential was set to 140 V. The results of measurements of the potential and image characteristics of the manufactured photosensitive member are shown in Table 4. The potential and image characteristics were evaluated in the same manner as Example 1. In comparison with Example 1, a deterioration was recognized with respect to spot defects.

The number of spot defects having a diameter of 0.1 mm or less was particularly large, although the influence was practically negligible. However, when an image original was copied, a certain difference in image quality from Example 2 was recognized.

(Example 3)

An a-Si photosensitive member was manufactured by using the apparatus used in Experimental Example 5 under the conditions shown in Table 2. The plasma potential was set to 100 V and the current density of ions incident upon the base was set to 2 mA/cm$^2$. The results of measurements of the potential and image characteristics of the manufactured photosensitive member are shown in Table 4. The potential and image characteristics were evaluated in the same manner as Example 1. Both the potential characteristics and the image characteristics were very good and the effect of the present invention was confirmed.

(Comparative Example 4)

An a-Si photosensitive member was manufactured in the same manner as Example 3 except that the current density of ions incident upon the base was set to 0.2 mA/cm$^2$. The results of measurements of the potential and image characteristics of the manufactured photosensitive member are shown in Table 4. The potential and image characteristics were evaluated in the same manner as Example 1. In comparison with Example 3, a deterioration was recognized with respect to photo-memory.

In particular, with a reduction in chargeability, the contaminated state of the main charging device after long-term copying was largely different from that of Example 3. A definite difference in maintenance performance from Example 3 was recognized.

(Comparative Example 5)

An a-Si photosensitive member was manufactured in the same manner as Example 3 except that the plasma potential was set to 140 V. The results of measurements of the potential and image characteristics of the manufactured photosensitive member are shown in Table 4. The potential and image characteristics were evaluated in the same manner as Example 1. In comparison with Example 3, a deterioration with respect to spot defects was considerable.

The number of spot defects having a diameter of 0.1 mm or less was particularly large, although the influence was practically negligible. However, when an image original was copied, a certain difference in image quality from Example 3 was recognized.

(Example 4)

An a-Si photosensitive member was manufactured by using the apparatus used in Example 2 under the conditions shown in Table 2. The current density of ions incident upon the base was set to 2 mA/cm$^2$ and the plasma potential was set to 100 V when a 3 μm thick film was formed on the base and to 140 V under the other conditions. The results of measurements of the potential and image characteristics of the manufactured photosensitive member are shown in Table 4. The potential and image characteristics were evaluated in the same manner as Example 1. Both the potential characteristics and the image characteristics were very good and the effect of the present invention was confirmed.

(Comparative Example 6)

A photosensitive member was manufactured by using the same apparatus and same conditions as Example 4 except that the plasma potential was set to 100 V when a 2 μm thick film was formed on the base and to 140 V under the other conditions. The results of measurements of the potential and image characteristics of the manufactured photosensitive member are shown in Table 4. In comparison with Example 4, a considerable deterioration with respect to spot defects was recognized.

The number of spot defects having a diameter of 0.1 mm or less was particularly large, although the influence was practically negligible. However, when an image original was copied, a certain difference in image quality from Example 4 was recognized.

(Example 5)

An a-SiC photosensitive member was manufactured by using the apparatus used in Example 2, introducing $CO_2$ and setting the oxygen ion density in plasma to $1\times10^6/cm^3$ under the conditions shown in Table 3. The plasma potential was set to 100 V and the current density of ions incident upon the base was set to 2 $mA/cm^2$. The results of measurements of the potential and image characteristics of the manufactured photosensitive member are shown in Table 4. The potential and image characteristics were evaluated in the same manner as Example 1. Both the potential characteristics and the image characteristics were very good and the effect of the present invention was confirmed.

(Comparative Example 7)

An a-SiC photosensitive member was manufactured in the same manner as Example 5 except that the current density of ions incident upon the base was set to 0.2 $mA/cm^2$. The results of measurements of the potential and image characteristics of the manufactured photosensitive member are shown in Table 4. The potential and image characteristics were evaluated in the same manner as Example 1. In comparison with Example 1, deteriorations were recognized with respect to chargeability, sensitivity and photo-memory.

In particular, with a reduction in chargeability, the contaminated state of the main charging device after long-term copying was largely different from that of Example 5. A definite difference in maintenance performance from Example 5 was recognized.

With a reduction in sensitivity, a fog was caused when a character original on color paper was copied, and the resulting copied image was not sufficiently clear.

(Example 6)

An a-SiC photosensitive member was manufactured by using the apparatus used in Experimental Example 7 under the conditions shown in Table 3. The plasma potential was set to 80 V and the current density of ions incident upon the base was set to 1 $mA/cm^2$. The current density of ions upon the first to third auxiliary electrodes was set to 0.5 $mA/cm^2$. The results of measurements of the potential and image characteristics of the manufactured photosensitive member are shown in Table 4. The potential and image characteristics were evaluated in the same manner as Example 1. Both the potential characteristics and the image characteristics were good and no problems were found.

TABLE 1

| Name of layer | Used gas/flow rate (sccm) | | RF power (W) | Internal pressure (Torr) | Support temperature (°C.) | Layer thickness (μm) |
|---|---|---|---|---|---|---|
| Second photo-conductive layer | $SiH_4$<br>$B_2H_6$ | 200<br>1000 ppm<br>(relative to $SiH_4$) | 300 | 0.5 | 250 | 3 |
| First photo-conductive layer | $H_2$<br>$SiH_4$<br>$H_2$ | 200<br>500<br>300 | 500 | 0.5 | 250 | 20 |
| Surface layer | $SiH_4$<br>$CH_4$ | 10<br>750 | 300 | 0.5 | 250 | 0.5 |

TABLE 2

| Name of layer | Used gas/flow rate (sccm) | | μW power (W) | Internal pressure (mTorr) | Support temperature (°C.) | Layer thickness (μm) |
|---|---|---|---|---|---|---|
| Second photo-conductive layer | $SiH_4$<br>$H_2$<br>$B_2H_6$ | 300<br>100<br>1000 ppm<br>(relative to $SiH_4$) | 1000 | 10 | 250 | 3 |
| First photo-conductive layer | $SiH_4$<br>$B_2H_6$<br>$H_2$ | 250<br>2 ppm<br>(relative to $SiH_4$)<br>250 | 1000 | 10 | 250 | 25 |
| Surface layer | $SiH_4$<br>$CH_4$ | 75<br>800 | 1000 | 10 | 250 | 0.5 |

TABLE 3

| Name of layer | Used gas/flow rate (sccm) | | μW power (W) | Internal pressure (mTorr) | Support temperature (°C.) | Layer thickness (μm) |
|---|---|---|---|---|---|---|
| Second photo-conductive layer | $SiH_4$<br>$CH_4$<br>$B_2H_6$<br>$H_2$ | 300<br>150<br>3 ppm<br>(relative to $SiH_4$)<br>250 | 1000 | 10 | 250 | 17 |
| First photo-conductive layer | $SiH_4$<br>$B_2H_6$<br>$H_2$ | 250<br>2 ppm<br>(relative to $SiH_4$)<br>250 | 1000 | 10 | 250 | 3 |
| Surface layer | $SiH_4$<br>$CH_4$ | 75<br>800 | 1000 | 10 | 250 | 0.5 |

TABLE 4

| | Vd | Sensitivity | Comb. pot. char. | Memory | Spot Defects | Comb. image char. | Comb. |
|---|---|---|---|---|---|---|---|
| Example 1 | 9 | 9 | 9 | 10 | 10 | 10 | 10 |
| Comp. Ex. 1 | 7 | 5 | 5 | 5 | 10 | 6 | 6 |
| Example 2 | 9 | 9 | 9 | 10 | 9 | 10 | 10 |
| Comp. Ex.2 | 7 | 5 | 5 | 7 | 9 | 8 | 7 |
| Comp. Ex. 3 | 9 | 9 | 9 | 10 | 7 | 9 | 9 |
| Example 3 | 9 | 9 | 9 | 10 | 9 | 10 | 10 |
| Comp. Ex. 4 | 5 | 5 | 5 | 7 | 9 | 5 | 5 |
| Comp. Ex. 5 | 9 | 9 | 9 | 10 | 5 | 7 | 8 |
| Example 4 | 9 | 9 | 9 | 10 | 9 | 10 | 10 |
| Comp. Ex. 6 | 9 | 9 | 9 | 10 | 6 | 8 | 9 |
| Example 5 | 10 | 10 | 10 | 10 | 9 | 10 | 10 |

TABLE 4-continued

|  | Vd | Sensitivity | Comb. pot. char. | Memory | Spot Defects | Comb. image char. | Comb. |
|---|---|---|---|---|---|---|---|
| Comp. Ex. 7 | 5 | 5 | 5 | 7 | 9 | 5 | 5 |
| Example 6 | 10 | 10 | 10 | 10 | 10 | 10 | 10 |

Worse ←←←←← Average →→→→→ Better Ranks 1 2 3 4 5 6 7 8 9 10 Vd: chargeability Comb. pot. char.: combined potential characteristic Memory: Photo-memory Comb. image char.: combined image characteristic According to the present invention, as described above, potential characteristics such as chargeability and photo-response and the effect of reducing photo-memory and defects which cause spot image defects can be simultaneously improved. Thus, the characteristics of photosensitive members can be improved and the proportion of non-defectives in a production process can also be improved.

According to the present invention, in a method of manufacturing an amorphous silicon electrophotographic photosensitive member by a plasma CVD process, at least electromagnetic waves having a frequency of 13.56 MHz or higher are used as power for generating plasma, and a film is formed under conditions that the spatial potential of plasma generated by the electromagnetic waves with respect to a base is not higher than 120 V and the current density of ions incident upon the base is not lower than 0.4 mA/cm$^2$, thereby improving the potential characteristics and reducing spot defects causing image defects and photo-memory.

This effect is particularly high if electromagnetic waves having a frequency of 2.45 GHz are used as power for generating plasma, if a film having a thickness of 3 μm or more is formed on the base under conditions that the spatial potential is not higher than 120 V and the incident ion current density is not lower than 0.4 mA/cm$^2$, and if ions of atoms in the group VII and/or the group VI in the periodic table are caused to exist in plasma, preferably, to an amount of 1×10$^5$/cm$^3$ or more and, more preferably, to an amount in the range of 1×10$^5$/cm$^3$ to 1×10$^8$/cm$^3$.

This effect can be obtained stably with improved reproducibility by increasing the current density of ions incident upon the base relative to the current density of ions incident upon places other than the base.

Further, it has been found that an unexpected effect shown below can also be achieved by the present invention. In a copying machine using an a-Si photosensitive member manufactured in accordance with the present invention, the wear of a cleaning blade of a cleaning section is small and the life of the cleaning blade can be extended by 1 to 20% in comparison with copying machines using a-Si photosensitive members manufactured by the conventional manufacturing methods. A similar result has also been recognized in the case of comparison using photosensitive members equal to each other in the number of spherical protrusions. This effect is thought to be due to some state change in the normal portion of the photosensitive medium surface.

What is claimed is:

1. An amorphous silicon photosensitive film formed by the process comprising:
   conducting a plasma chemical vapor deposition using electromagnetic waves having a frequency of 13.56 MHz or higher as power for generating plasma, wherein the spatial potential of plasma generated by the electromagnetic waves with respect to a base of the photosensitive member is not higher than 120 V and the current density of ions incident upon the base is not lower than 0.4 mA/cm$^2$ to form the film.

2. A film according to claim 1, employing electromagnetic waves having a frequency in a microwave band as power for generating said plasma.

3. A film according to claim 1, including forming the film on the base to a thickness of at least 3 μm.

4. A film according to claim 1, including forming the film by employing a plasma density of ions of atoms in at least one of Group VII and Group VI of the Periodic Table of at least 1×10$^5$/cm$^3$.

5. A film according to claim 2, including providing a current density of ions incident upon the base of the photosensitive member higher than the current density of ions incident upon portions of the photosensitive member other than the base.

6. A film according to claim 2, including employing the frequency of the microwave band of 2.45 GHz.

7. A film according to claim 4, including forming the film at a plasma density of ions of no greater than 1×10$^8$/cm$^3$.

* * * * *